United States Patent
Myung-Seok et al.

(10) Patent No.: US 7,884,357 B2
(45) Date of Patent: Feb. 8, 2011

(54) ORGANIC ELECTRONIC DEVICE, METHOD FOR PRODUCTION THEREOF, AND ORGANIC SEMICONDUCTOR MOLECULE

(75) Inventors: Choi Myung-Seok, Kanagawa (JP); Ryoichi Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 568 days.

(21) Appl. No.: 11/746,356

(22) Filed: May 9, 2007

(65) Prior Publication Data

US 2008/0012010 A1    Jan. 17, 2008

(30) Foreign Application Priority Data

| May 18, 2006 | (JP) | ............ 2006-138996 |
| Nov. 1, 2006 | (JP) | ............ 2006-297470 |

(51) Int. Cl.
*H01L 51/00* (2006.01)

(52) U.S. Cl. .................... 257/40; 257/642; 257/759; 257/E51.001

(58) Field of Classification Search ............ 257/40, 257/642, 643, 759, E51.01, E51.107, E51.001
See application file for complete search history.

(56) References Cited

U.S. PATENT DOCUMENTS

| 7,057,206 B2 | 6/2006 | Halik et al. | |
| 7,081,210 B2 * | 7/2006 | Hirai et al. | ............ 252/62.3 Q |

FOREIGN PATENT DOCUMENTS

| JP | 2003-298067 | 10/2003 |
| JP | 2004-088090 | 3/2004 |
| JP | 2006-080346 | 3/2006 |
| JP | 2006-517543 | 7/2006 |
| JP | 2005-531132 | 2/2009 |
| WO | 2006/054709 | 5/2006 |

OTHER PUBLICATIONS

Chesterfield, et al., "High Electron Mobility and Ambipolar Transport in Organic Thin-Film Transistors Based on a Π-Stacking Quinoidal Terthiophene," Adv. Mater. Aug. 5, 2003, 15, No. 15, pp. 1278-1282.

Abdelrazzaq, et al., "Photocurrent Generation in Multilayer Organic-Inorganic Thin Films with Cascade Energy Architectures," J. Am. Chem. Soc., 2002, 124, pp. 4796-4803.

Facchetti, et al., "Building Blocks for n-Type Organic Electronics: Regiochemically Modulated Inversion of Majority Carrier Sign in Perfluoroarene-Modified Polythiophene Semiconductors," Angew. Chem. Int. Ed. 2003, 42, pp. 3900-3903.

(Continued)

*Primary Examiner*—Thinh T Nguyen
(74) *Attorney, Agent, or Firm*—K&L Gates LLP

(57) ABSTRACT

An organic electronic device which has stable physical properties and which allows easy production is provided. The organic electronic device has a conductive path including fine particles, a first organic semiconductor molecule which has a first conductive type and binds at least two of the fine particles together, and a second organic semiconductor molecule which has a second conductive type and is captured in a state of noncovalent bond in a molecule recognition site that exists among the fine particles.

9 Claims, 17 Drawing Sheets

OTHER PUBLICATIONS

Imahori, et al., "Host-Guest Interactions in the Supramolecular Incorporation of Fullerenes into Tailored Holes on Porphyrin-Modified Gold Nanoparticles in Molecular Photovoltaics," Chem. Eur. J. 2005, 11, pp. 7265-7275.

Tour et al., "Synthesis and Preliminary Testing of Molecular Wires and Devices," Chem. Eur. J. 2001, 7, No. 23, pp. 5118-5134.

Tashiro, et al., "A Cyclic Dimer of Metalloporphyrin Forms a Highly Stable Inclusion Complex with C60," J. Am. Chem. Soc. 1999, 121, pp. 9477-9478.

Locklin, et al., "Ambipolar Organic Thin Film Transistor-like Behavior of Cationic and Anionic Phthalocyanines Fabricated Using Layer-by-Layer Deposition from Aqueous Solution," Chem. Mater. 2003, 15, 1404-1412.

Shirakawa, et al., "Fullerene-Motivated Organogel Formation in a Porphyrin Derivative Bearing Programmed Hydrogen-Bonding Sites," J. Am. Chem. Soc. 2003, 125, pp. 9902-9903.

Yoon, et al., "Organic Thin-Film Transistors Based on Carbonyl-Functionalized Quaterthiophenes: High Mobility N-Channel Semiconductors and Ambipolar Transport," J. Am. Chem. Soc. 2005, 127, pp. 1348-1349.

Xiao, et al, "Electrochemical Gate-Controlled Conductance of Single Oligo(phenylene ethynylene)s," J. Am. Chem. Soc. 2005, 127, pp. 9235-9240.

Hasobe, et al., "Quaternary Self-Organization of Porphyrin and Fullerene Units by Clusterization with Gold Nanoparticles on SnO2, Electrodes for Organic Solar Cells," J.Am. Chem. Soc. 2003, 125, pp. 14962-14963.

Ando, et al., "n-Type Organic Field-Effect Transistors with Very High Electron Mobility Based on Thiazole Oligomers with Trifluoromethylphenyl Groups," J. Am. Chem. Soc. 2005, 127, 14996-14997.

Sakamoto, et al., "Perfluoropentacene: High-Performance p-n Junctions and Complementary Circuits with Pentacene," J. Am. Chem. Soc. 2004, 126, pp. 8138-8140.

Sih et al., "Metal nanoparticle—conjugated polymer nanocomposites," Chem. Commun., 2005, pp. 3375-3384.

* cited by examiner

FIG. 8A
[STEP-320]
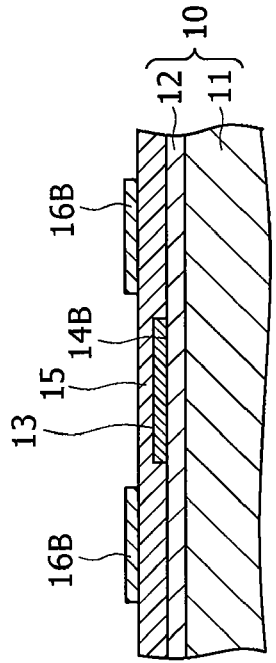
TFT OF p-CHANNEL TYPE
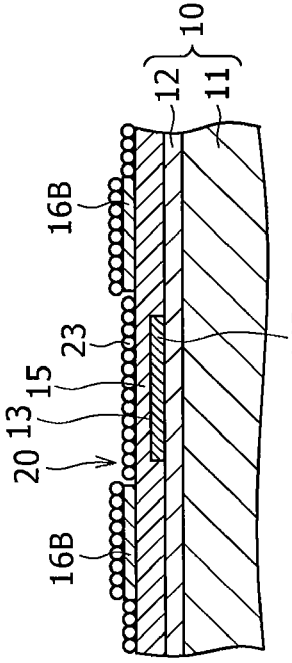
TFT OF n-CHANNEL TYPE
FIG. 8B
[STEP-330]
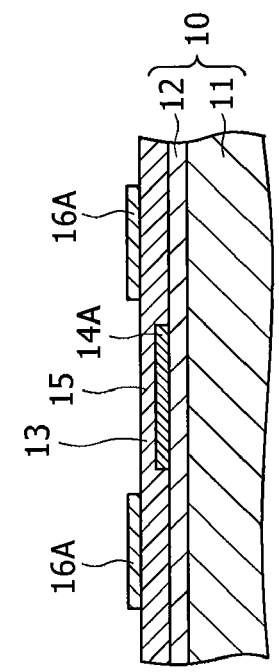
TFT OF p-CHANNEL TYPE
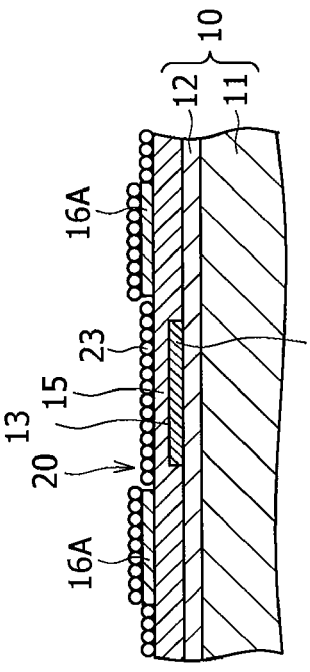
TFT OF n-CHANNEL TYPE

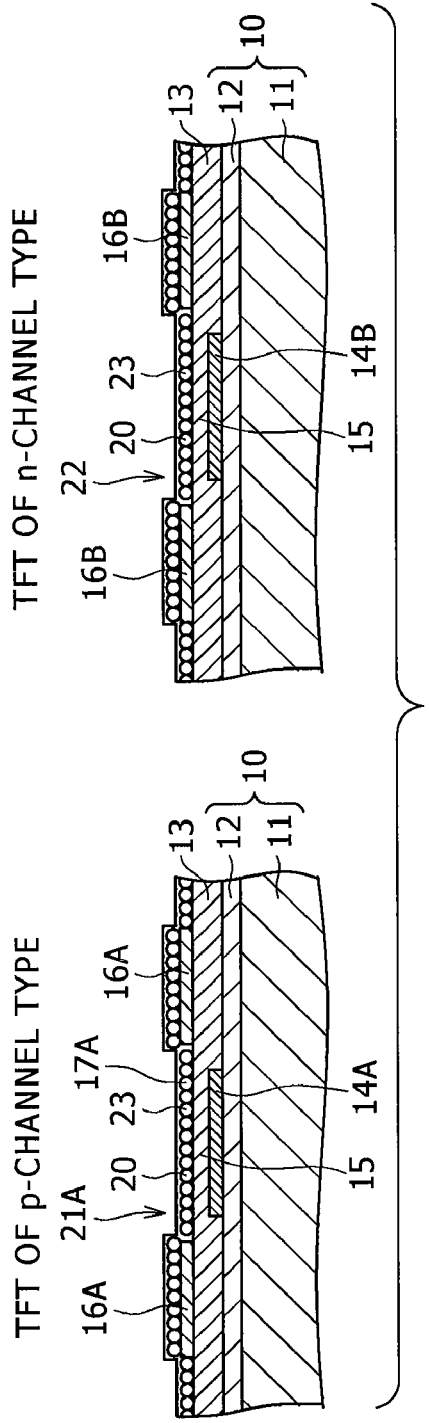
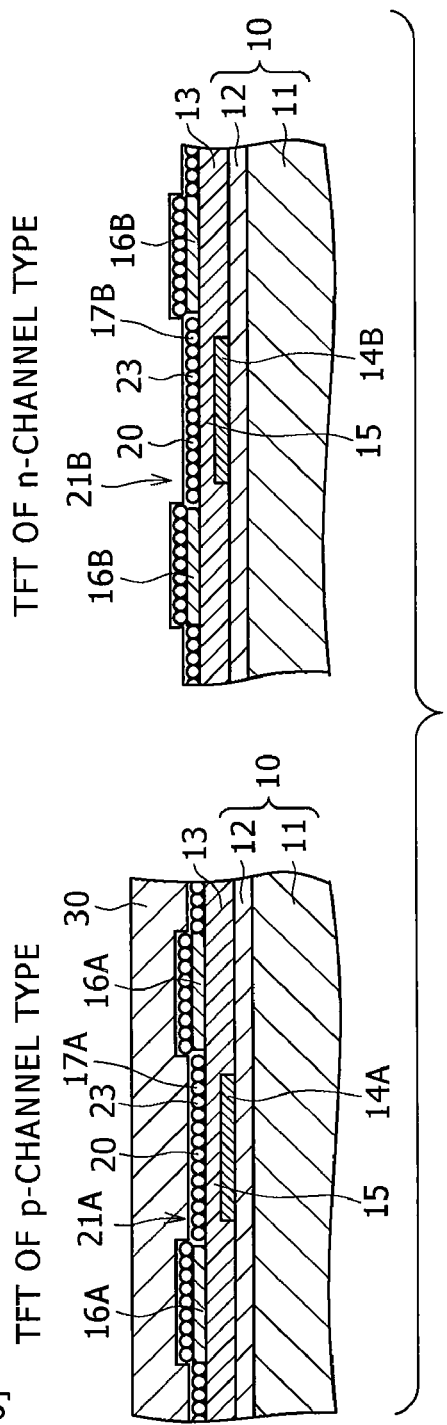

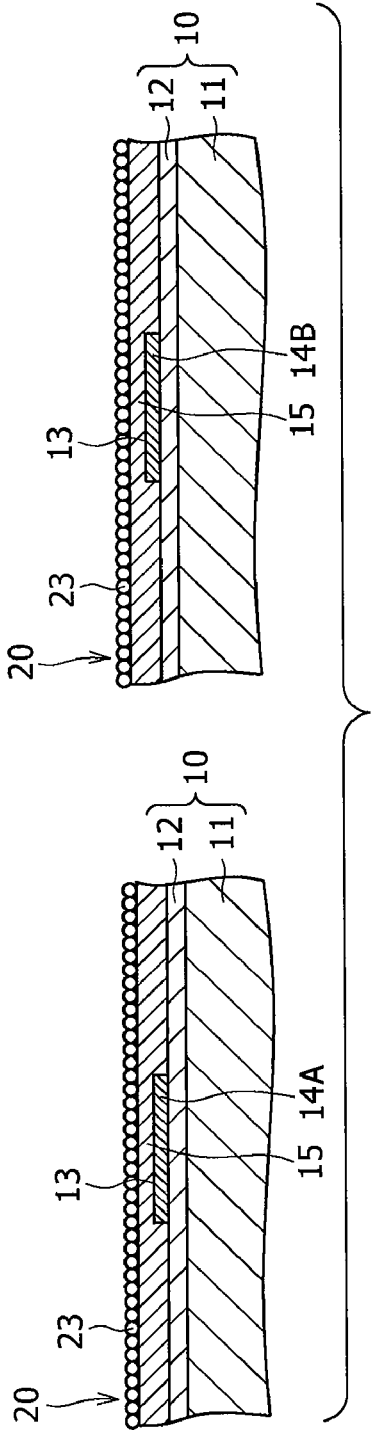
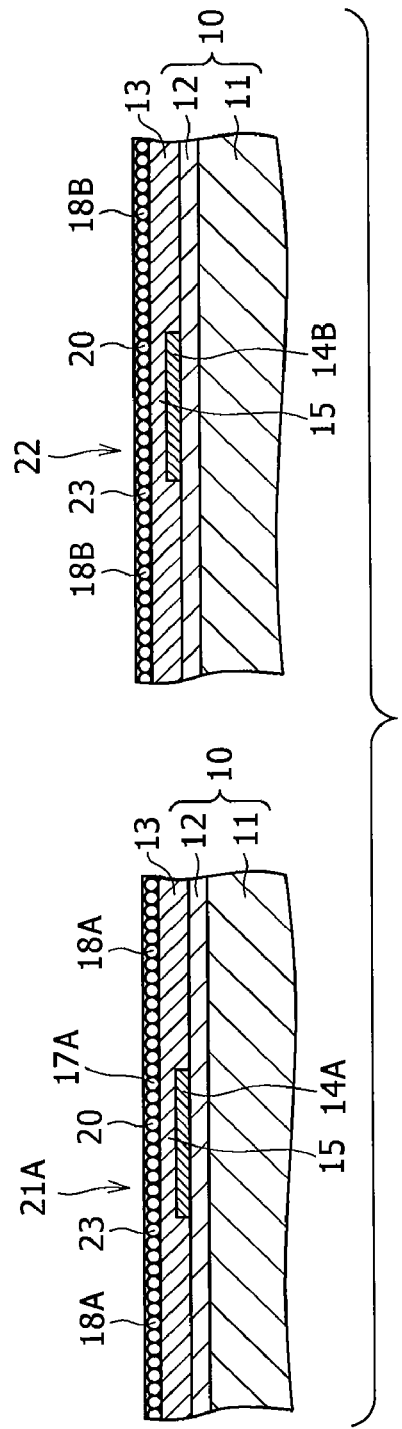

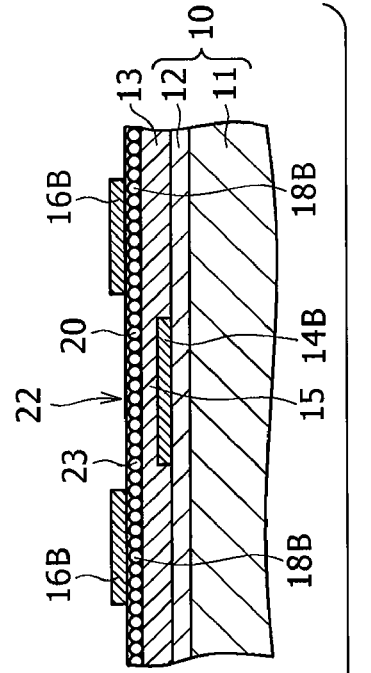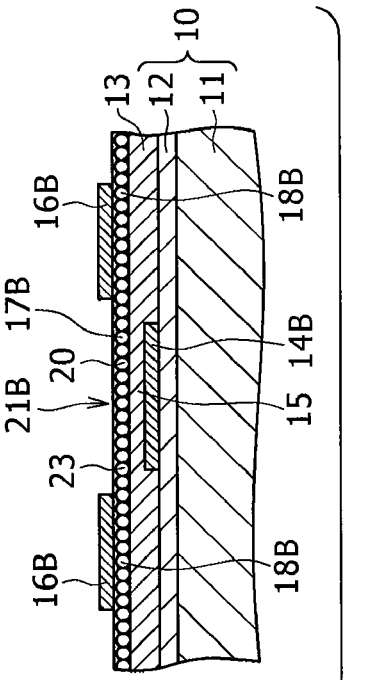
FIG. 12A [STEP-420]
FIG. 12B [STEP-430]

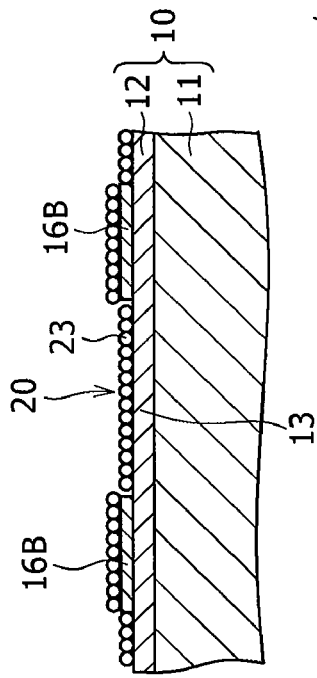
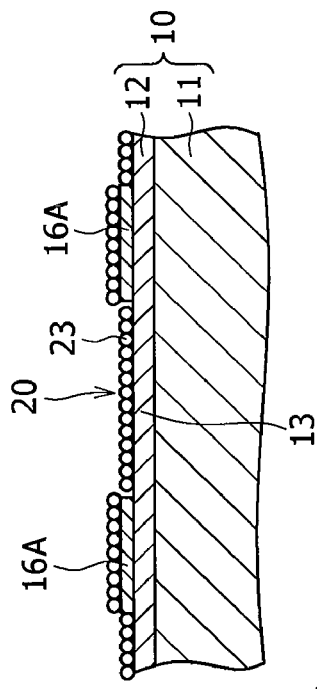
FIG. 13A
[STEP-500]
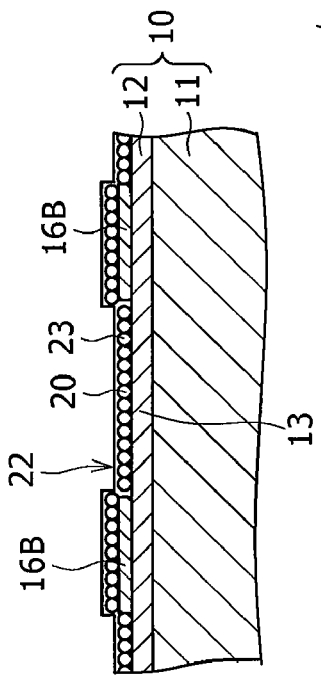
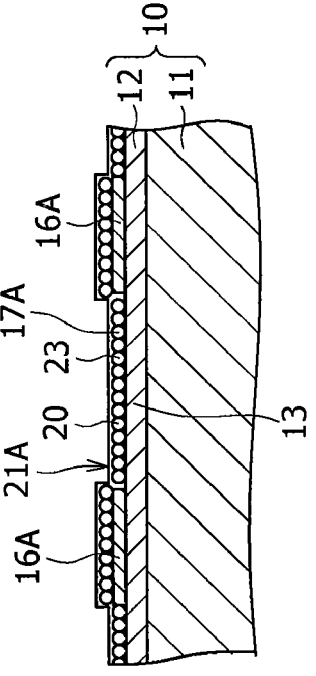
FIG. 13B
[STEP-510]

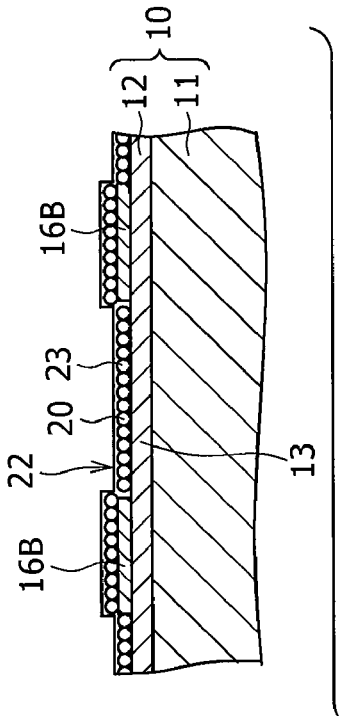
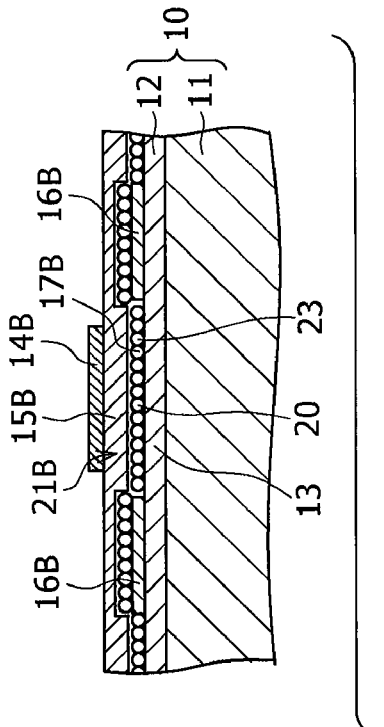
FIG. 14A [STEP-520]
FIG. 14B [STEP-540]

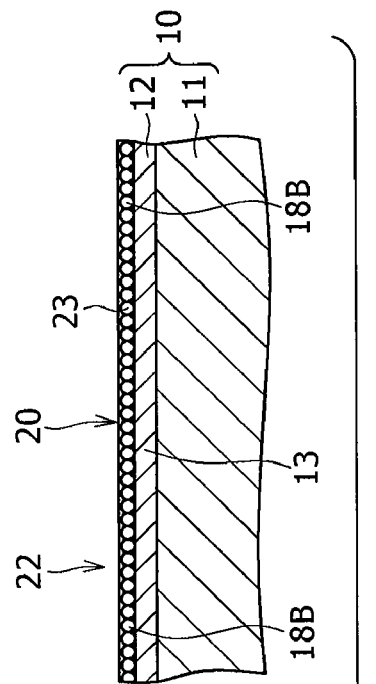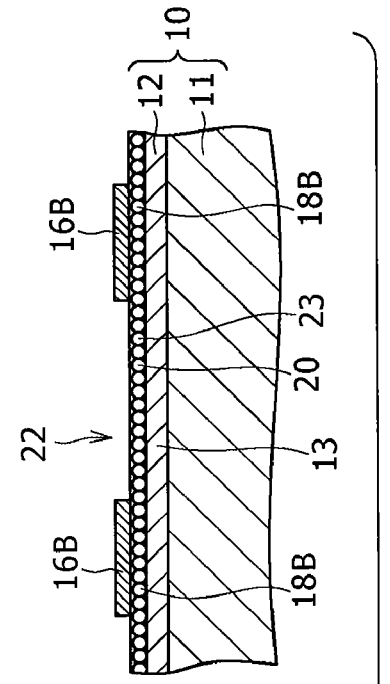
FIG. 15A [STEP-610]
FIG. 15B [STEP-620]

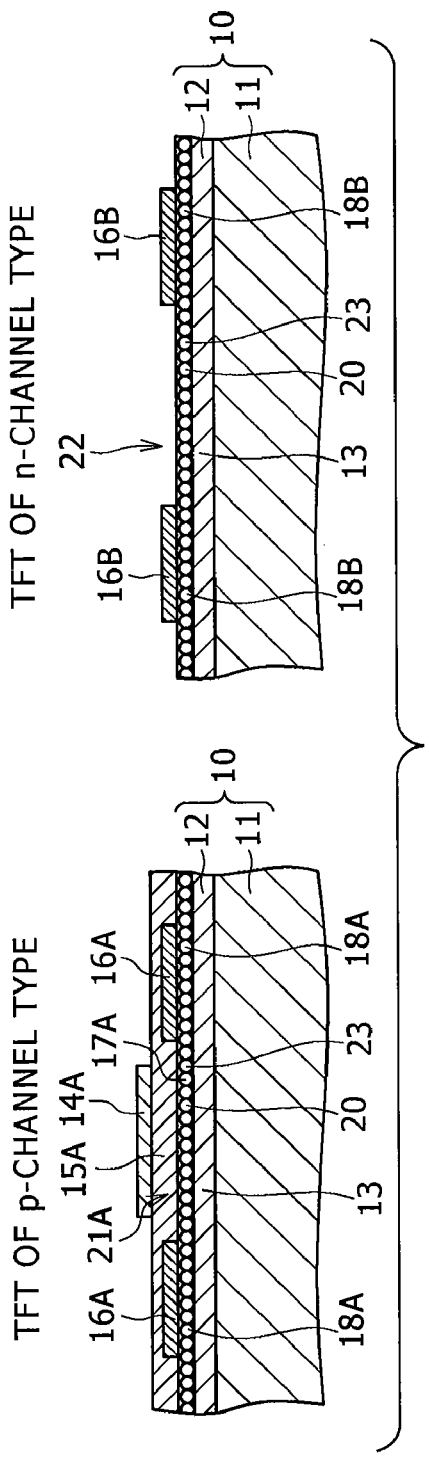
FIG. 16A [STEP-630]
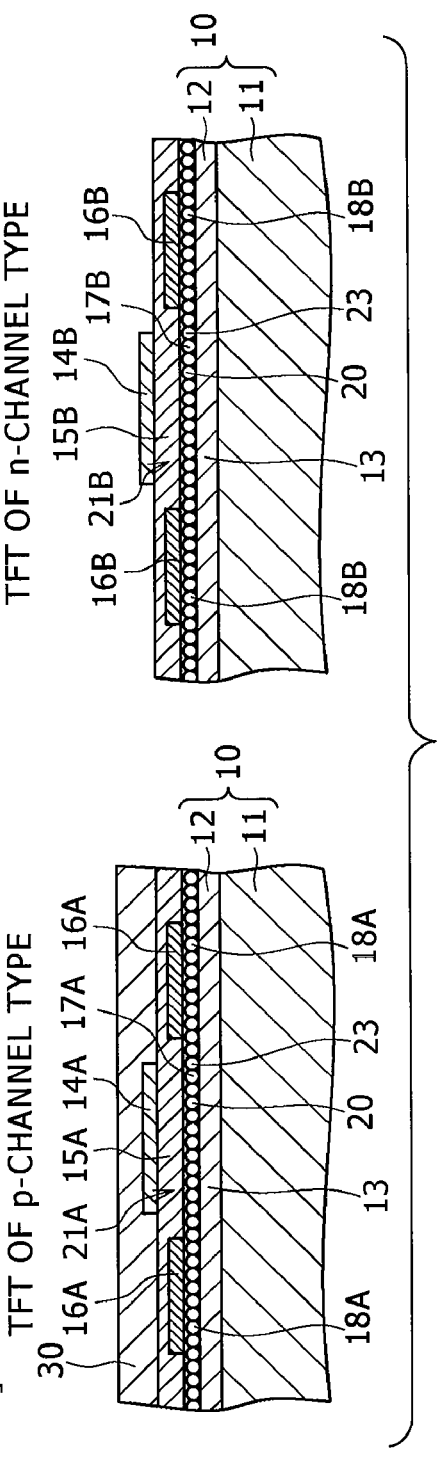
FIG. 16B [STEP-650]

ORGANIC ELECTRONIC DEVICE, METHOD FOR PRODUCTION THEREOF, AND ORGANIC SEMICONDUCTOR MOLECULE

CROSS REFERENCES TO RELATED APPLICATIONS

The present application claims priority to Japanese Patent Application Nos. JP 2006-138996 filed in the Japan Patent Office on May 18, 2006; and JP 2006-297470 filed in the Japan Patent Office on Nov. 1, 2006, the entire contents of which are being incorporated herein by reference.

BACKGROUND

The present application relates to an organic electronic device, a method for production thereof, and a new organic semiconductor molecule.

A large variety of electronic devices rely on field effect transistors (FET) including thin film transistors (TFT). The FET consists of a channel-forming region and a source/drain region which are formed in a silicon semiconductor substrate or a silicon semiconductor layer, a gate insulating layer of $SiO_2$ which is formed on the surface of a silicon semiconductor substrate or a silicon semiconductor layer, and a gate electrode opposite to the channel-forming region, with the gate insulating layer interposed. Alternatively, it consists of a gate electrode formed on a support, a gate insulating layer covering the support including the gate electrode, and a channel-forming region and a source/drain region which are formed on the gate insulating layer. FETs with such a structure need a very expensive semiconductor manufacturing system, and their production is being challenged for cost reduction.

Much attention is now focused on research and development of organic semiconductor devices including FETs based on organic semiconductor materials capable of production by spin coating, printing, or spraying, which do not need vacuum technology. Organic semiconductor materials reported so far are mostly p-type ones but scarcely n-type ones. Both n-type and p-type organic semiconductor materials should be developed side by side so that they are applied to p-n junction, optoelectric conversion element, bipolar transistors, complementary transistors, and other transistors (see Shinji, A., et al. J. Am. Chem, Soc. 2005, 127, 14996 hereinafter referred to as Non-Patent Document 1, Facchetti, A., et al. Angew. Chem. Int. Ed. 2003, 42, 3900 hereinafter referred to as Non-Patent Document 2, Locklin, A. J., et al. Chem. Mater. 2003, 15, 1404 hereinafter referred to as Non-Patent Document 3, and Chesterfield, R. J., et al. Adv. Mater. 2003, 15, 1278 hereinafter referred to as Non-Patent Document 4). Among coatable n-type organic semiconductor materials are pentacene substituted with fluoroalkyl groups (see Sakamoto, Y., et al. J. Am. Chem. Soc. 2004, 126, 8138 hereinafter referred to as Non-Patent Document 5), oligothiophene and thiazole oligomer (see Yoon, M. H., et al. J. Am. Chem. Soc. 2005, 127, 1348 hereinafter referred to as Non-Patent Document 6). Development of p-type organic semiconductor materials with improved characteristic properties is crucial.

For their application to various devices, the n-type organic semiconductor materials that appear in the documents listed above are synthesized by complex processes in several stages. However, development of simple processes is very important for economical production of organic electronic devices in practical use. The main disadvantage of n-type organic semiconductor materials is susceptibility to oxidation in air, which leads to their limited selections and necessitates complicated fabrication processes for their fabrication into organic electronic devices. Moreover, there is also a need for p-type organic semiconductor materials with improved characteristic properties.

SUMMARY

In an embodiment, an organic electronic device is provided with stable properties feasible in a comparatively simple manner and to provide a method for production thereof. It is a second embodiment to provide an organic semiconductor molecule with improved properties, an organic electronic device based thereon, and a method for production thereof.

An organic electronic device is provided in an embodiment which has a conductive path including:

(A) fine particles, (B) a first organic semiconductor molecule which has a first conductive type and binds at least two of the fine particles together, and (C) a second organic semiconductor molecule which has a second conductive type and is captured in a state of noncovalent bond in a molecule recognition site that exists among the fine particles.

In an embodiment, a method for production of an organic electronic device is provided which includes forming on a substrate a layer including:

(a) fine particles and (b) a first organic semiconductor molecule which has a first conductive type and binds at least two of the fine particles together, and subsequently bringing the layer into contact with a second organic semiconductor molecule which has a second conductive type, thereby obtaining a conductive path including:

(A) fine particles, (B) a first organic semiconductor molecule which has a first conductive type and binds at least two of the fine particles together, and (C) a second organic semiconductor molecule which has a second conductive type and is captured in a state of noncovalent bond in a molecule recognition site that exists among the fine particles.

The term "molecule recognition" denotes a phenomenon that a certain molecule selectively combines with a specific molecule instead of any arbitrary molecule to form micelle, addition compound, cluster, mixed crystal, or the like. The term "molecule recognition site" denotes a site in which a second organic semiconductor molecule combines with a first one to form a supermolecular micelle through their selective intermolecular force. The term "captured in a state of noncovalent bond" means that the second organic semiconductor molecule is in the following state. That is, the second organic semiconductor molecule is confined, by π-π mutual action with the first organic semiconductor molecule, in a large number of nano spaces with network structure formed by the fine particles joined together by the first organic semiconductor molecule. The fact that the second organic semiconductor is captured in a state of noncovalent bond in a molecule recognition site existing among fine particles can be proven by measurement of UV-Vis absorption spectrum after thorough washing. The resulting absorption spectrum contains a peak due to the second organic semiconductor molecule. It also contains a peak due to the first organic semiconductor molecule, which is shifted to the long-wave side by the intermolecular mutual action with the second organic semiconductor molecule. Moreover, the micelle formation between the first organic semiconductor molecule and the second organic semiconductor molecule can be observed by fluorescence attenuation or transition absorption which are induced by energy transfer between molecules or accelerated electron mobility.

In an embodiment, an organic electronic device is provided which has a conductive path including:

(A) fine particles and (B) an organic semiconductor molecule binding at least two of the fine particles together, and which behaves as p-type, wherein the organic semiconductor molecule is represented by the structural formula (1) below.

In an embodiment, a method for production of an organic electronic device is provided which includes forming on a substrate a layer of fine particles and dipping the substrate with the layer of fine particles in a solution containing an organic semiconductor molecule represented by the structural formula (1) below, thereby forming a conductive path including fine particles and the organic semiconductor molecule binding at least two of the fine particles together.

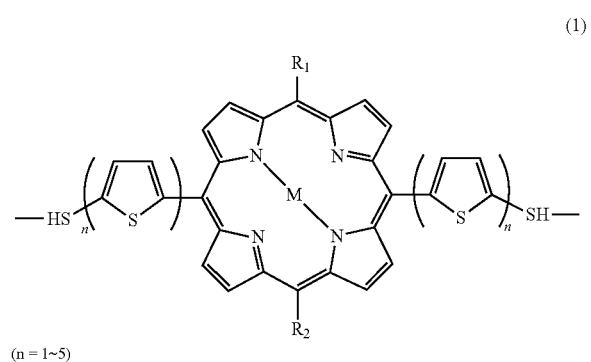

(n = 1~5)

(1)

where, in structural formula (1), $R_1$ and $R_2$ denote alkyl groups, M denotes 2H, $Zn^{+2}$, $Mg^{+2}$, $Fe^{+2}$, $Co^{+2}$, $Ni^{+2}$, or $Cu^{+2}$, and n is an integer of 1 to 5. Incidentally, the conductive path is a layer including fine particles and organic semiconductor molecule.

The organic semiconductor molecule in an embodiment is represented by the structural formula (2) below, in which $R_1$ and $R_2$ denote alkyl groups, M denotes 2H, $Zn^{+2}$, $Mg^{+2}$, $Fe^{+2}$, $Co^{+2}$, $Ni^{+2}$, or $Cu^{+2}$, and n is an integer of 1 to 5. Incidentally, this organic semiconductor molecule exhibits the p-type conductive type.

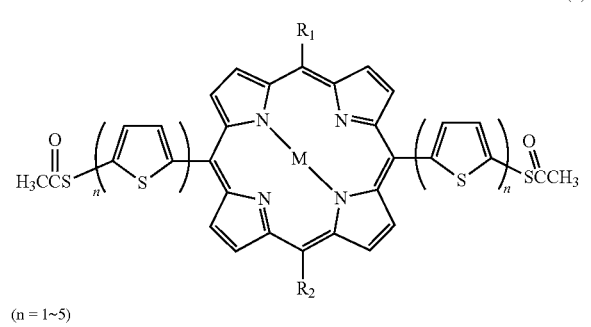

(n = 1~5)

(2)

The structural formula (1) generally represents thiopheneporphyrin having thiol groups, and the structural formula (2) generally represents thiopheneporphyrin having thioacetyl groups. The porphyrin organic semiconductor molecule represented by the structural formula (1) or (2) is including three moieties: anchor for chemical bonding with the surface of fine particles, π-conjugated spacer, and porphyrin skeleton. In the structural formula (1) or (2), the alkyl group $C_mH_{2m+1}$ represented by $R_1$ and $R_2$ should preferably have a carbon number (integer m) of 3 to 18. $R_1$ and $R_2$ may be the same or different. $R_1$ and $R_2$ may be replaced by $X_1$ and $X_2$, respectively, which are aromatic substituents including aryl groups.

In an embodiment, organic electronic device and a method for production thereof, may be designed such that the first conductive type is p-type and the second conductive type is n-type. In this case, the conductive path behaves as n-type, which is the second conductive type. The second organic semiconductor molecule may be stable fullerene (of $C_{60}$ or $C_{70}$ spherical carbon molecule), TNT (2,4,6-trinitrotoluene), quantum dot, or conjugated oligomer. The foregoing may be modified such that the first conductive type is n-type and the second conductive type is p-type. In this case, the conductive path behaves as p-type, which is the second conductive type.

In an embodiment, the first organic semiconductor molecule has a functional group chemically binding to fine particles. More preferably, it may be modified such that the first organic semiconductor molecule has functional groups at both terminals that chemically bind (alternately) with fine particles to form network conductive paths. Alternatively, a single layer resulting from fine particles joined by the first organic semiconductor molecule may constitute the conductive path. Further, a laminate layer resulting from fine particles joined by the first organic semiconductor molecule may constitute the three-dimensional network conductive path. Such network conductive paths cause the charge transfer in the conductive path to take place mainly in the axial direction of the molecule along the main chain of the first organic semiconductor molecule, with no electron transfer occurring between molecules in the conductive path. The result is high mobility in the direction of molecules or high mobility due to non-localized π-electrons because mobility is not limited any longer by electron transfer between molecules which has been a cause of low mobility in the semiconductor device with a conventional organic semiconductor material. Thus the resulting high mobility may be one which has never been achieved and is comparable to that of the monomolecular layer transistor. The first organic semiconductor molecule may be an organic semiconductor molecule having conjugated bond, with each molecule having at its both terminals at least one kind of functional groups selected from the group consisting of thiol group (—SH), amino group (—$NH_2$), isocyano group (—NC), thioacetyl group (—$SCOCH_3$), trichlorosilyl group (—$Si(Cl)_3$), ammonium group (—$NH_3^+$), phosphoric group, and carboxyl group (—COOH).

According to an embodiment, the organic electronic device or the method for production thereof should preferably be designed such that the organic semiconductor molecule has a functional group (thiol groups) chemically binding to fine particles or they chemically (alternately) bind with fine particles through functional group (thiol groups) at both terminals thereof, so that they constitute network conductive paths. A modification may be made such that the conductive paths of single layer including fine particles and organic semiconductor molecule may be constituted; alternatively, another modification may be made such that the three-dimensional network conductive paths including fine particles and organic semiconductor molecule may be constructed. Such network conductive paths make the charge transfer in the conductive path to take place dominantly in the axial direction of the molecule of the main chain of the organic semiconductor molecule, and the resulting structure is such that the conductive paths do not contain electron transfer between molecules. The result is high mobility in the direction of molecules or high mobility due to non-localized π-electrons because mobility is not limited any longer by electron transfer between molecules which has been a cause of low mobility in the semiconductor device with a conventional organic semiconductor material. Thus the resulting high mobility may be one which has never been achieved and is comparable to that of the monomolecular layer transistor.

Moreover, in an embodiment, fine particles may be a conductor or a semiconductor or an insulator. Incidentally, fine particles as a conductor denote those of such a material which has a volume resistivity of the order of $10^{-4}$ Ω·m ($10^{-2}$ Ω·cm) or less. Fine particles as a semiconductor denote those of such a material which has a volume resistivity of the order of $10^{-4}$ Ω·m ($10^{-2}$ Ω·cm) to $10^{12}$ Ω·m ($10^{14}$ Ω·cm). Fine particles as an insulator denote those of such a material which has a volume resistivity of the order of $10^{12}$ Ω·m ($10^{14}$ Ω·cm) or above. The material constituting fine particles as a conductor includes, for example, gold (Au), silver (Ag), platinum (Pt), copper (Cu), aluminum (Al), palladium (Pd), chromium (Cr), nickel (Ni), iron (Fe), and alloys thereof. The material constituting fine particles as a semiconductor includes, for example, titanium oxide ($TiO_2$), tin oxide ($SnO_2$), cadmium sulfide (CdS), cadmium selenide (CdSe), cadmium telluride (CdTe), gallium arsenide (GaAs), and silicon (Si). The material constituting fine particles as an insulator includes, for example, silicon oxide ($SiO_x$). The mean particle size $R_{AVE}$ of the fine particles is not specifically restricted; it should be in the range of $5.0 \times 10^{-10}$ m $\leq R_{AVE} \leq 1.0 \times 10^{-6}$ m, preferably $R_{AVE} \leq 1.0 \times 10^{-8}$ m, more preferably $5.0 \times 10^{-10}$ m $\leq R_{AVE} \leq 1.0 \times 10^{-8}$ m. The shape of the fine particles may be sphere; it also includes triangle, tetrahedron, cube, rectangular parallelepiped, cone, cylinder (rod), prism, fiber, and fuzz ball fiber. The mean particle size of fine particles in any other shape than sphere may be calculated on the assumption that each particle to be measured has the same volume as a sphere. The mean particle size of fine particles may be measured from observation under a transmission electron microscope (TEM).

In an embodiment, the fine particles on the substrate may be two-dimensionally regularly arranged within a plane approximately parallel to the surface of the substrate and also arranged in the filled state to constitute the layer of fine particles. The fine particles should preferably be arranged in the closest packing state. The term "fine particles are arranged in the closest packing state" means that fine particles are arranged such that the conductive paths including fine particles and the first organic semiconductor molecule or the conductive paths including fine particles and the organic semiconductor molecule are formed between the source and drain electrodes. Needless to say, there may exist some depletion or lattice defects. The term "fine particles are arranged in the closest packing state" means that when the fine particles, regarded as rigid body, regularly arrange themselves with the maximum density to physically occupy the two-dimensional plane or three-dimensional space. Fine particles do not come into contact with one another because there exist the first organic semiconductor molecule between adjacent particles. The surface distance between adjacent particles is the same as or shorter than the length in the long axial direction of the organic semiconductor molecules employed. When fine particles are arranged on the substrate in the plane approximately parallel to the surface of the substrate, the regularly arranged two-dimensional layer may be a monolayer or in the form of multilayer that exists in the three-dimensional closest packing state. The term "two-dimensionally regularly arranged" means that fine particles of uniform particle diameter are arranged in the closest packing state in the space equivalent to about one layer of particles. The term "within the plane approximately parallel to the surface of the substrate" means that they are substantially parallel to minute irregularities which might exist on the surface of the substrate depending on the method by which the substrate is produced.

In the following, the term "bound layer" will be used to denote the bound layer including fine particles and the first organic semiconductor molecule or the bound layer including fine particles and the organic semiconductor molecules. The bound layer may be formed by first forming a layer of fine particles on the substrate. The layer of fine particles may be obtained by coating the substrate with a thin film of solution containing fine particles by dipping, casting, spin coating, electrodeposition, and advection accumulation (A. S. Dimitrov et al., Langmuir, 10, 432 (1994)), followed by solvent evaporation from the thin film. Fine particles in the thin film take the close pack arrangement. Solvent evaporation from the thin film should be carried out at a controlled rate. Alternatively, the layer of fine particles may be obtained by a method similar to the LB (Langmuir-Blodgett) method that forms a thin film from a solution containing fine particles and transfer of the resulting thin film onto the substrate. This process involves floating fine particles with a hydrophobic surface on the surface of a hydrophilic solvent (such as water) so that they form a two-dimensionally arranged monolayer or floating fine particles with a hydrophilic surface on the surface of a hydrophobic solvent, and subsequent transfer as in LB method (V. Santhanum, et al., Langmuir, 2003, 19, 7881). The resulting layer of fine particles is including fine particles arranged in the closest packing state. Specifically, the layer of fine particles is obtained by forming a thin film on the water surface from a solution containing fine particles, followed by solvent evaporation from the thin film. Solvent evaporation from the thin film should be carried out at a properly controlled rate.

The process for forming the bound layer may include a step of forming a layer of fine particles and a subsequent step of bringing the first organic semiconductor molecule into contact with the layer of fine particles at least once, so that fine particles are bound to the first organic semiconductor molecule. Performing the step of bringing the first organic semiconductor molecule into contact with the layer of fine particles once forms a monolayer of bound layer. Performing the step of bringing the first organic semiconductor molecule into contact with the layer of fine particles more than twice forms a bound layer of laminate structure. Bringing the first organic semiconductor molecule into contact with the layer of fine particles may be accomplished by dipping the layer of fine particles into a solution containing the first organic semiconductor molecule, or alternatively by coating the layer of fine particles with a solution containing the first organic semiconductor molecule by coating or printing (mentioned later), followed by drying. In this way the bond layer can be obtained.

The bound layer including fine particles and the first organic semiconductor molecule may also be obtained by mixing a solution containing fine particles with the first organic semiconductor molecule, thereby giving clusters including (by reaction) fine particles and the first organic semiconductor molecule, and forming on the substrate a thin film containing these clusters, followed by drying. The method for mixing a solution containing fine particles with the first organic semiconductor molecule may be properly selected according to the first organic semiconductor molecule to be used for the solution containing fine particles. Another method may be used depending on the solution containing fine particles and the first organic semiconductor molecule. This method involves placing the powdered first organic semiconductor molecule in a solution containing fine particles, followed by slight mixing. This method gives clusters in which fine particles are bound with the first organic semiconductor molecule. The thin film containing clusters may be formed by dipping, casting, coating, or LB-like method. Clusters may be arranged one-dimensionally, two-dimensionally, or three-dimensionally; their selection depends on the state of application of the solution containing clusters.

The clusters in which fine particles are bound with the organic semiconductor molecule are those in which fine particles are three-dimensionally joined together through the first organic semiconductor molecule. For example, they are an aggregate including thousands to millions of fine particles joined together through the first organic semiconductor molecule. Their size ranges from 0.1 μm to 1 μm. When the clusters are placed between the source and drain electrodes, on the gate insulating layer, or on the substrate, clusters are joined to clusters or clusters are joined to the source and drain electrodes by the first organic semiconductor molecule that exists on the surface of the clusters. In some cases, this joining is accomplished by application, followed by drying, of a solution containing the first organic semiconductor molecule to the clusters. The clusters have a large number of conductive paths consisting of fine particles and the first organic semiconductor molecule. There will be as many clusters as 8000 in a cube measuring 100 nm filled with fine particles with a particle diameter of 5 nm packed in the cubic lattice. These fine particles are crosslinked together by a large number of the first organic semiconductor molecule. An extremely large number of conductive paths are responsible for an increased current.

Incidentally, the solvent contained in the thin film include non-polar or less polar organic solvents such as toluene, chloroform, hexane, and ethanol.

It is desirable from the standpoint of preventing fine particles from aggregation that the fine particles before joining with the first organic semiconductor molecule have their surface coated with a protective coating of insulating organic molecules of chain structure. The molecules constituting the protective film bind to fine particles and the magnitude of the binding force greatly affects the final particle size distribution in the production of fine particles covered with the protective film (practically aggregate of fine particles covered with the protective film). The insulating organic molecules constituting the protective film should have a functional group that chemically react (join) with fine particles. Examples of such functional groups include thiol group (—SH). An example of the compound having a thiol group is alkane thiol, such as dodecane thiol $C_{12}H_{25}SH$. The thiol group in dodecane thiol binds with fine particles of gold to give $C_{12}H_{25}S$—Au through elimination of a hydrogen atom. Another example of the insulating organic compound constituting the protective film is an alkylamine compound, such as dodecylamine $C_{12}H_{25}NH_2$. When fine particles are brought into contact with the first organic semiconductor molecule, the latter are replaced by the organic molecules constituting the first organic semiconductor molecule, with the result that fine particles and the first organic semiconductor molecule form the chemically bound body.

The first organic semiconductor molecule that crosslink fine particles possesses functional groups at both terminals capable of joining fine particles. In a situation where the distance between particles is longer than the entire length of the first organic semiconductor molecule and fine particles are fixed to the substrate and immobile state, the conductive path is cut there and hence the number of conductive paths constructed by fine particles and the first organic semiconductor molecule decreases, and this leads to deterioration of the characteristic properties of the organic electronic device. When an organic electronic device with outstanding characteristic properties is to be obtained, or in the case where this organic electronic device is constructed of field effect transistors (FET), it is necessary that the conductive paths be continuous without breakage from one source/drain electrode to the other source/drain electrode. The number of conductive paths greatly affects the characteristic properties of FET. For the number of conductive paths to increase, it is desirable that fine particles are adjacent to each other at a distance smaller than the length of the first organic semiconductor molecule and fine particles are two-dimensionally regularly arranged in hexagonal closest packing state. Specifically, the surface of fine particle before joining with the first organic semiconductor molecule is protected with the protective film of insulating organic molecules in chain form. Therefore, the distance between fine particles is about twice the length of the molecules constituting the protective film (in practice, slightly shorter because of overlapping of molecules at the ends). The length of the first organic semiconductor molecule that crosslink these fine particles should not be longer than the thus determined distance between fine particles.

According to an embodiment, the first organic semiconductor molecule is an organic semiconductor molecule having the conjugate bond and also having at their terminals thiol group (—SH), amino group (—NH$_2$), isocyano group (—NC), cyano group (—CN), thioacetyl group (—SCOCH$_3$), trichlorosilyl group (—Si(Cl)$_3$), ammonium group (—NH$_3^+$), phosphoric group, and carboxyl group (—COOH). Of those, thiol group, amino group, isocyano group, cyano group, thioacetyl group, trichlorosilyl group, ammonium group and phosphoric group, are functional groups that bind with fine particles as a conductor such as gold, while carboxyl group, trichlorosilyl group, ammonium group and phosphoric group are functional groups that bind with fine particles as a semiconductor. The functional groups at both terminals of the molecule may be different from each other; they should be similar to each other in reactivity for fine particles. The first organic semiconductor molecule may be a π-conjugated compound having (at least two positions) functional groups that chemically bind with fine particles.

According to an embodiment, the first organic semiconductor molecule that exhibit the p-type conductive type includes porphyrin (expounded later), 4,4'-biphenyldithiol (BPDT) of the structural formula (11), 4,4'-diisocyanobiphenyl of the structural formula (12), 4,4'-diisocyano-p-terphenyl of the structural formula (13), 2,5-bis-(5'-thioacetyl-2'-thiophenyl)thiophene of the structural formula (14), 4,4'-diisocyanophenyl of the structural formula (15), benzidine (biphenyl-4,4'-diamine) of the structural formula (16), TCNQ (tetracyanoquinodimethane) of the structural formula (17), biphenyl-4,4'-dicarboxylic acid of the structural formula (18), 1,4-di(4-thiophenylacetylinyl)-2-ethylbenzene of the structural formula (19), and 1,4-di(4-isocyanophenylacetylinyl)-2-ethylbenzene of the structural formula (20).

Structural formula (11): 4,4'-biphenyldithiol

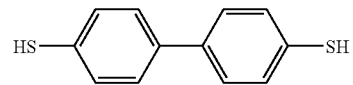

Structural formula (12): 4,4'-diisocyanobiphenyl

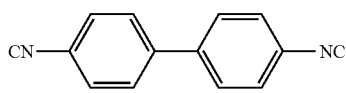

Structural formula (13): 4,4'-diisocyano-p-terphenyl

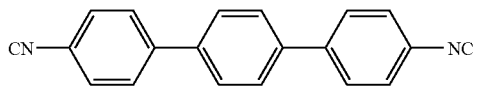

Structural formula (14): 2,5-bis(5'-thioacetyl-2'-thiophenyl)thiophene

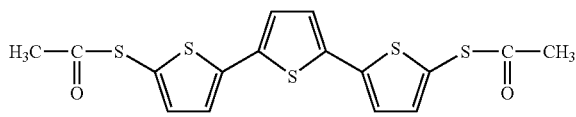

Structural formula (15): 4,4'-diisocyanophenyl

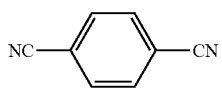

Structural formula (16): benzidine(biphenyl-4,4'-diamine)

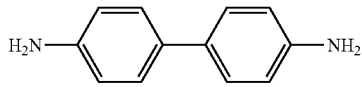

Structural formula (17): TCNQ (tetracyanoquinodimethane)

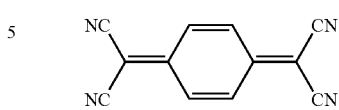

Structural formula (18): biphenyl-4,4'-dicarboxylic acid

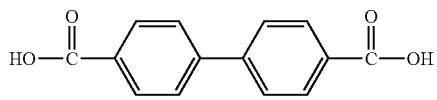

Structural formula (19): 1,4-di(4-thiophenylacetylinyl)-2-ethylbenzene

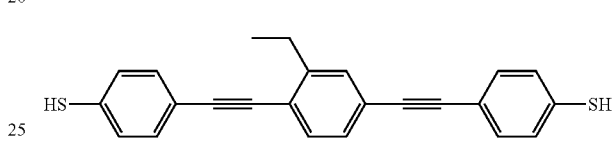

Structural formula (20): 1,4-di(4-isocyanophenylacetylinyl)-2-ethylbenzene

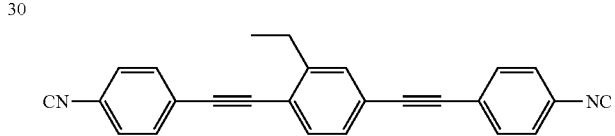

According to an embodiment, the first organic semiconductor molecule may be dendrimer of the structural formula (21).

Structural formula (21): dendrimer

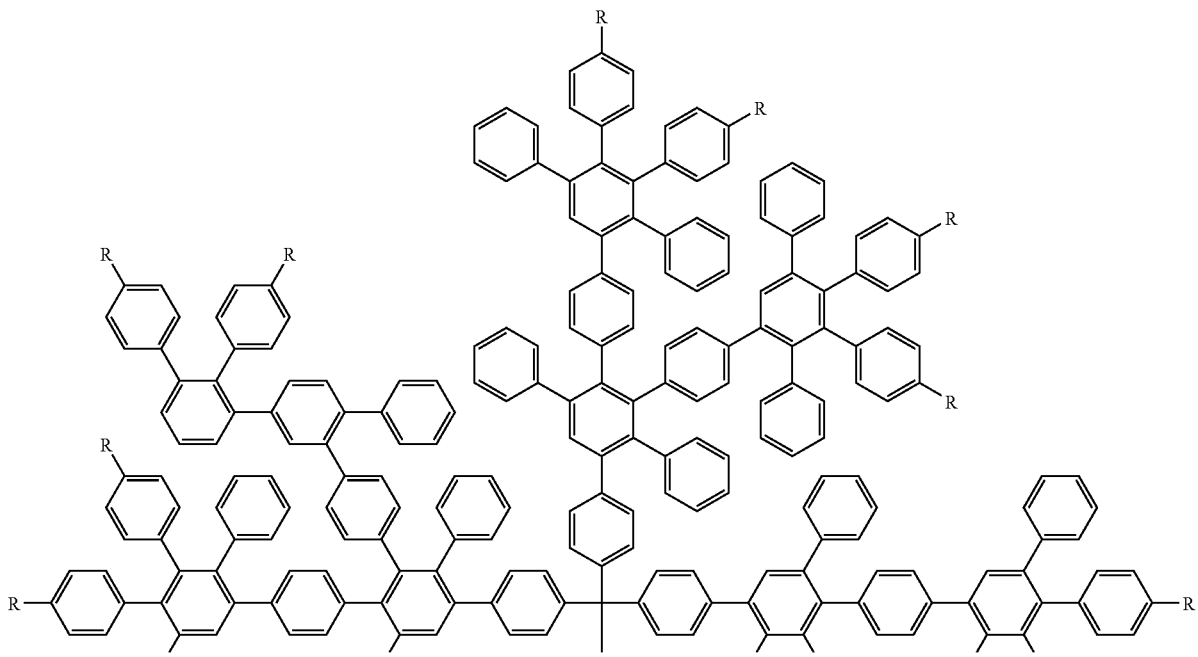

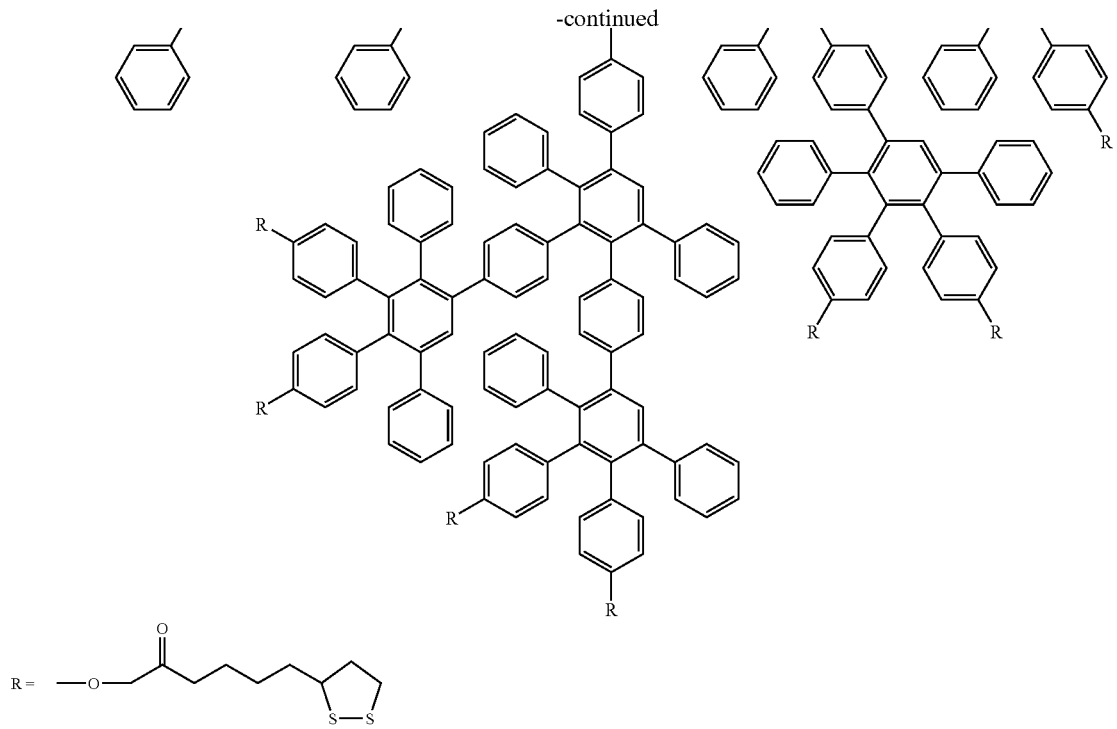

According to an embodiment, the organic semiconductor molecule may be an organic compound represented by the structural formula (22), in which X denotes any of the formulas (23-1), (23-2), (23-3), and (23-4), $Y_1$ and $Y_2$ denote any of the formulas (24-1) to (24-9), $Z_1$, $Z_2$, $Z_3$, and $Z_4$ denote any of the formulas (25-1) to (25-11), and n is 0 or a positive integer. Also, X is including more than one unit (identical or different) represented by any of the formulas (23-1), (23-2), (23-3), and (23-4). The side chains $Z_1$, $Z_2$, $Z_3$, and $Z_4$ may be including different repeating units.

$$Y_1—X—Y_2 \quad (22)$$

(23-1)

(23-2)

(23-3)

(23-4)

| | |
|---|---|
| —SH | (24-1) |
| —NH$_2$ | (24-2) |
| —COCH | (24-3) |
| —CN | (24-4) |
| —NC | (24-5) |
| —SCOCH$_3$ | (24-6) |
| (HS, S structure) | (24-7) |
| —NCS | (24-8) |
| —SCN | (24-9) |
| —H | (25-1) |
| —F | (25-2) |
| —Cl | (25-3) |
| —Br | (25-4) |
| —I | (25-5) |
| —(CH$_2$)$_n$CH$_3$ | (25-6) |
| —O(CH$_2$)$_n$CH$_3$ | (25-7) |
| —(C=O)(CH$_2$)$_n$CH$_3$ | (25-8) |
| —(C=O)O(CH$_3$)$_n$CH$_3$ | (25-9) |
| —NH$_2$ | (25-10) |
| —NO$_2$ | (25-11) |

The bound layer including fine particles and the first organic semiconductor molecule may be brought into contact with the second organic semiconductor molecule having the second conductive type in different manners depending of the phase (solid, liquid, or gas) of the second organic semiconductor molecule. The contacting may be accomplished by dipping the bound layer in a solution containing the second organic semiconductor molecule or by exposing the bound layer to a gas (or vapor) containing the second organic semiconductor molecule. Moreover, in the first embodiment for the preferred form or constitution mentioned above, the organic electronic device is a field effect transistor (FET) which has the channel forming region, with the conductive path therein behaving as the second conductive type. In the second embodiment for the preferred form or constitution mentioned above, the organic electronic device is a field effect transistor (FET) which has the channel forming region, with the conductive path therein behaving as the p-type. Incidentally, the field effect transistor may be of bottom gate/bottom contact type, bottom gate/top contact type, top gate/bottom contact type, or top gate/top contact type.

Specifically, the field effect transistor of bottom gate/bottom contact type may have:

(A) a gate electrode formed on the support, (B) a gate insulating layer (corresponding to the substrate) formed on the gate electrode and support, (C) source/drain electrodes formed on the gate insulating layer, and (D) a channel forming region which is formed between the source/drain electrodes on the gate insulating layer and is constructed by the conductive path.

The field effect transistor of bottom gate/top contact type may have:

(A) a gate electrode formed on the support, (B) a gate insulating layer (corresponding to the substrate) formed on the gate electrode and support, (C) a layer constituting the channel forming region which is formed on the gate insulating layer and includes the channel forming region constructed by the conductive path, and (D) source/drain electrodes formed on the layer constituting the channel forming region.

The field effect transistor of top gate/bottom contact type may have:

(A) source/drain electrodes formed on the substrate, (B) a channel forming region which is formed between the source/drain electrodes on the substrate and is constructed by the conductive path, (C) a gate insulating layer formed on the source/drain electrodes and channel forming region, and (D) a gate electrode formed on the gate insulating layer.

The field effect transistor of top gate/top contact type may have:

(A) a layer constituting the channel forming region which is formed on the substrate and includes the channel forming region constructed of the conductive path, (B) source/drain electrodes formed on the layer constituting the channel forming region, (C) a gate insulating layer formed on the source/drain electrodes and channel forming region, and (D) a gate electrode formed on the gate insulating layer.

The substrate may be formed from silicon oxide material (such as $SiO_x$ and spin on glass (SOG)), silicon nitride ($SiN_y$), aluminum oxide ($Al_2O_3$), or metal oxide high-dielectric insulating film. Any of these materials may be used to form the substrate on a support of organic polymer such as polymethyl methacrylate (PMMA), polyvinyl alcohol (PVA), polyvinyl phenol (PVP), polyether sulfone (PES), polyimide, carbonate (PC), and polyethylene terephthalate (PET). The organic polymer is in the form of flexible film or sheet. Another material for the support is mica. The substrate made of flexible polymeric material permits the organic electronic device to be built into or integrated with a curved display unit. Other examples of the substrate (or support) include glass substrate, glass substrate having an insulating layer formed thereon, quartz substrate, quartz substrate having an insulating layer formed thereon, and silicon substrate having an insulating layer formed thereon. The electrically insulating support may be properly selected from the above-mentioned materials. Other examples of the support include conducting substrate of metal (such as gold and aluminum) and highly oriented graphite. The organic electronic device in certain form or structure may be formed on a support made of any of the above-mentioned materials.

The organic electronic device may be a field effect transistor, in which the gate electrode and source/drain electrodes and wirings may be formed from any of the following materials. Metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo). Alloys of metals listed above. Conductive particles made of metals listed above. Conductive particles containing metals listed above. Conductive materials such as impurity-containing polysilicon. These materials may be used in the form of laminate structure. Additional examples of materials for the gate electrode and source/drain electrodes include poly(3,4-ethylenedioxythiophene)/polystyrenesulfonic acid [PEDOT/PSS] which is a conductive polymer.

Any of the following methods will be employed to form the gate electrode and source/drain electrodes and wirings. Physical vapor deposition(PVD), chemical vapor deposition (CVD) including MOCVD, screen printing and ink jet printing, offset printing, gravure printing, spin coating, dipping, stamping, air doctor coating, blade coating, rod coating, knife coating, squeeze coating, reverse roll coating, transfer roll coating, gravure coating, kiss coating, cast coating, spray coating, slit orifice coating, calender coating, lift off method, sol-gel method, electrodeposition, shadow mask method, electrolytic and electroless plating and combination thereof, and combination of spraying and patterning. Incidentally, the PVD method includes (a) electron beam heating method, resistance heating method, flush vapor deposition, and any other vacuum vapor deposition; (b) plasma vapor deposition; (c) diode sputtering, DC sputtering, DC magnetron sputtering, high-frequency sputtering, magnetron sputtering, ion beam sputtering, bias sputtering, and any other sputtering; and (d) DC ion plating, RF ion plating, multi-cathode ion plating, activation reaction ion plating, high-frequency ion plating, reactive ion plating, and any other ion plating methods.

The organic electronic device may be a field effect transistor, in which the gate insulating layer (corresponding to the substrate) may be formed from any of the following materials. Silicon oxide material, silicon nitride ($SiN_y$), aluminum oxide ($Al_2O_3$), and any other metal oxide high dielectric insulating material; and organic insulating material (organic polymer). Examples of the latter include polymethyl methacrylate (PMMA), polyvinyl phenol (PVP), polyvinyl alcohol (PVA), polyimide, polycarbonate (PC), polyethylene terephthalate (PET), polystyrene, silanol derivative (or silane coupling agent) such as N-2-(aminoethyl)-3-aminopropyltrimethoxysilane (AEAPTMS), and 3-mercaptopropyltrimethoxysilane (MPTMS); and linear hydrocarbons, such as octadecyldecanethiol and dodecylisocyanate, having a functional group that binds to the gate electrode. They may be used in combination. Incidentally, silicon oxide materials include silicon oxide ($SiO_x$), BPSG, PSG, BSG, AsSG, PbSG, silicon oxide nitride (SiON), SOG (spin on glass), and low-dielectric SiO$_2$ material (such as polyaryl ether, cycloperfluorocarbon polymer, benzocyclobutene, cyclic fluororesin, polytetrafluoroethylene, fluorinated aryl ether, fluorinated polyimide, amorphous carbon, and organic SOG.

The gate insulating layer may be formed by any of PVD, CVD, printing, spin coating, dipping coating, casting, gol-gel method, electrodeposition, shadow mask method, and spraying, which have been mentioned above. Moreover, it may also be formed by oxidizing or nitriding the surface of the gate electrode, or by forming oxide film or nitride film on the surface of the gate electrode. Oxidation of the surface of the gate electrode may be accomplished by O$_2$ plasma oxidation or anodic oxidation. Nitriding of the surface of the gate electrode may be accomplished with the help of N$_2$ plasma, depending on the material constituting the gate electrode. The Au gate electrode may be covered with a gate insulating layer in a self-organizing way by dipping with insulating molecules having functional groups that chemically bind thereto, such as linear hydrocarbon modified with a terminal mercapto group. It is also possible to form a gate insulating layer by modifying the surface of the gate electrode with a silanol derivative (silane coupling agent).

For application to display units and various electronic machines and equipment, the organic electronic device may be used in the form of monolithic integrated circuits on a support or in the form of discrete parts, with or without resin sealing.

The organic electronic device may be used not only as field effect transistors mentioned above but also as transistors capable of molecule recognition; therefore, it will be applied to molecular sensors. Moreover, it will find use as photoelectric converters, light emitting elements, and switching devices if proper selection is made of fine particles and the first and second organic semiconductor molecules.

According to an embodiment, the first organic semiconductor molecule is used as linker molecules to make a monolayer of fine particles into a network, and the second organic semiconductor molecule is allowed to be selectively captured as guest molecules in the molecule recognition site including nano space arising from the network, so that the conductive path that behaves as the first conductive type due to combination of fine particles and the first organic semiconductor molecule is easily converted into the conductive path that behaves as the second conductive type. In other words, a transistor of p-channel type can be easily converted into a transistor of n-channel type by a simple manufacturing process. That is, it is not necessary to synthesize an n-type organic semiconductor material by complex process in several stages, but it is possible to reduce the production cost of various organic electronic devices owing to the development of simpler processes. The n-type organic semiconductor materials can be selected from a wide variety of candidates which are stable and resistant to oxidation in air. Therefore, the organic electronic device can be produced without complex processes.

According to an embodiment, the organic electronic device has outstanding characteristic properties because the conductive path for the channel forming region is constructed of the new organic semiconductor molecule.

Moreover, the organic electronic device according to embodiment is characterized in that charge transfer in the conductive path takes place predominantly in the axial direction of the molecule along the main chain of the first organic semiconductor molecule because fine particles are joined with the first organic semiconductor molecule, so that mobility in the axial direction of the molecule (or high mobility due to non-localized π-electrons) can be fully utilized. The result is high mobility. Moreover, the conductive path can be formed without high-temperature process or vacuum process, and conductive path of desired thickness can be formed easily and the organic electronic device can be produced at a low cost.

Additional features and advantages are described herein, and will be apparent from, the following Detailed Description and the figures.

BRIEF DESCRIPTION OF THE FIGURES

FIGS. 8A and 8B are schematic sectional views showing the substrate of the organic electronic device (field effect transistor) in Example 3. They are intended to illustrate the process of fabrication;

FIGS. 9A and 9B are schematic sectional views showing the substrate of the organic electronic device (field effect transistor) in Example 3. They are intended to illustrate the process of fabrication that follows the step shown in FIG. 8B;

FIGS. 11A and 11B are schematic sectional views showing the substrate of the organic electronic device (field effect transistor) in Example 4. They are intended to illustrate the process of fabrication;

FIGS. 12A and 12B are schematic sectional views showing the substrate of the organic electronic device (field effect transistor) in Example 4. They are intended to illustrate the process of fabrication that follows the step shown in FIG. 11B;

FIGS. 13A and 13B are schematic sectional views showing the substrate of the organic electronic device (field effect transistor) in Example 5. They are intended to illustrate the process of fabrication;

FIGS. 14A and 14B are schematic sectional views showing the substrate of the organic electronic device (field effect transistor) in Example 5. They are intended to illustrate the process of fabrication that follows the step shown in FIG. 13B;

FIGS. 15A and 15B are schematic sectional views showing the substrate of the organic electronic device (field effect transistor) in Example 5. They are intended to illustrate the process of fabrication.

FIGS. 16A and 16B are schematic sectional views showing the substrate of the organic electronic device (field effect transistor) in Example 5. They are intended to illustrate the process of fabrication that follows the step shown in FIG. 15B;

DETAILED DESCRIPTION

A detailed description follows according to an embodiment with reference to the drawings.

EXAMPLE 1

Figure 1A:
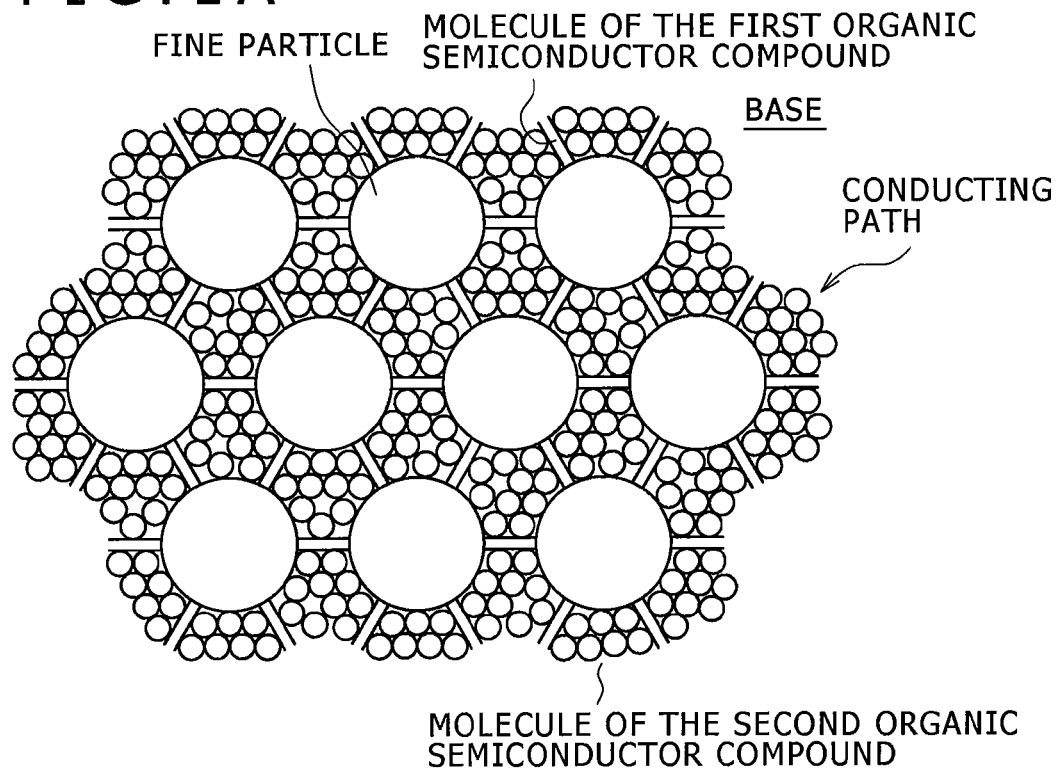
FIG. 1 is a schematic diagram showing the conductive path constituting the organic electronic device pertaining to an embodiment.

Example 1 covers the first and second embodiments for the organic electronic device, the method for production thereof, and the organic semiconductor molecule. The organic electronic device pertaining to a first embodiment has the conductive path, which, as schematically shown in FIG. 1A, is composed of:

(A) fine particles, (B) a first organic semiconductor molecule (called linker molecules, corresponding to host molecules) which has a first conductive type (p-type in Example 1) and bind the fine particles together, and (C) a second organic semiconductor molecule (corresponding to guest molecules) which has a second conductive type (n-type in Example 1) and is captured in a state of noncovalent bond in a molecule recognition site that exists among the fine particles.

Specifically, in Example 1, fine particles are composed of gold (Au) particles with their surface covered by protective film (not shown) and having a mean particle size $R_{AVE}$=5 nm, the first organic semiconductor molecule is composed of porphyrin having the p-type conductive type, the second organic semiconductor molecule is composed of fullerene ($C_{60}$) having the n-type conductive type, and the second organic semiconductor molecule is capable of intermolecular action with the first organic semiconductor molecule. And, the conductive path as a whole behaves as n-type. The functional group which the first organic semiconductor molecule possess at the terminal is chemically bound to fine particles. Specifically, the first organic semiconductor molecule is an organic semiconductor molecule having the conjugate bond and possess the thiol groups (—SH) at both ends of its molecule. Incidentally, the structural formula of the first organic semiconductor molecule (the structural formula before the functional group possessed at the terminals are replaced by the thiol groups) are shown in the following structural formula (101). For reference, the first organic semiconductor molecule having the thiol group (—SH) at only one terminal of its molecule was also synthesized. The structural formula of the first organic semiconductor molecule of Reference Example 1 (the structural formula before the functional group possessed at the terminals are replaced by the thiol groups) are shown in the following structural formula (102).

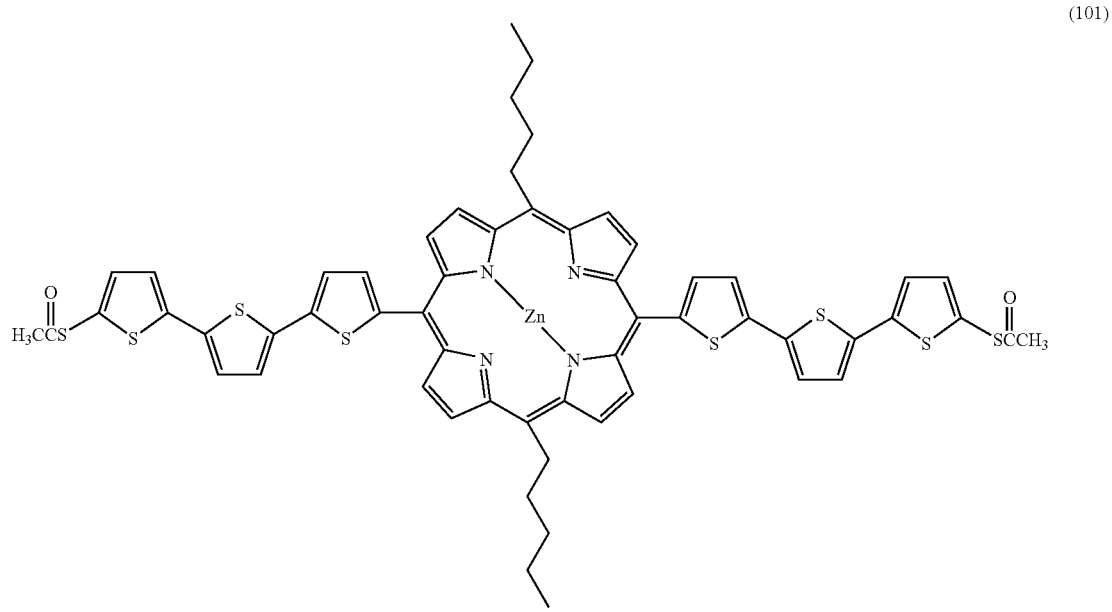

(101)

-continued

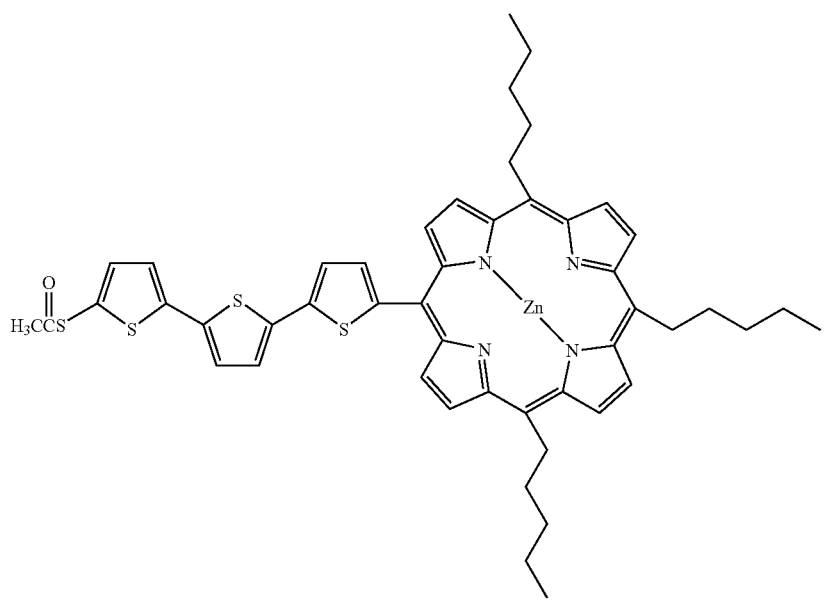

(102)

Figure 1B:
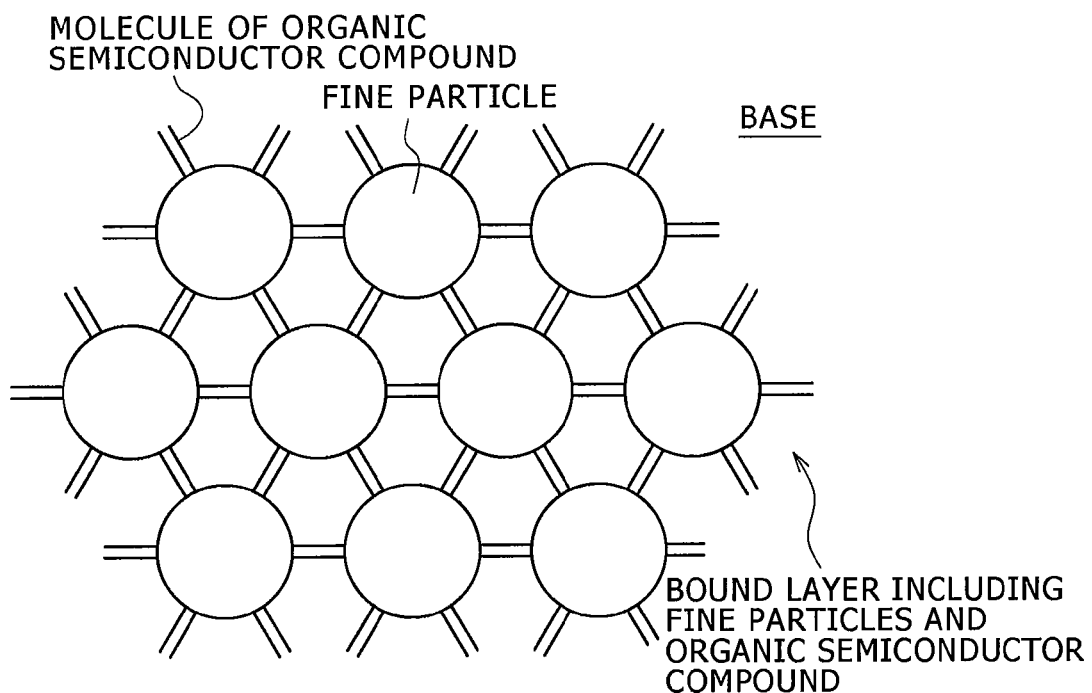

On the other hand, the organic electronic device pertaining to a second embodiment has the conductive path, and this conductive path, as shown in the schematic diagram of FIG. 1B, is composed of:

(A) fine particles, and (B) an organic semiconductor molecule joining fine particles together, and it behaves as p-type. And, this organic semiconductor molecule, which is thiophene porphyrin having thiol groups, is represented by the following structural formula (1). Also, the new organic semiconductor molecule before the functional group possessed at the terminals are replaced by the thiol groups, which is one kind of precursor to obtain the organic semiconductor molecule of the structural formula (1) is represented by the following structural formula (2), provided that $R_1$ and $R_2$ in the structural formulas (1) and (2) denote specifically $C_5H_{11}$ in Example 1 and M denotes $Zn^{+2}$ in Example 1, and n=3. Also, fine particles are as mentioned above. The functional group (the thiol group (—SH), specifically) which the organic semiconductor molecule possesses at the terminals chemically bind with fine particles. Incidentally, the value of m in $R_1$ and $R_2$ influences the solubility of the organic semiconductor molecule, and if the value of m becomes excessively large, the solubility of the organic semiconductor molecule becomes poor.

(1)

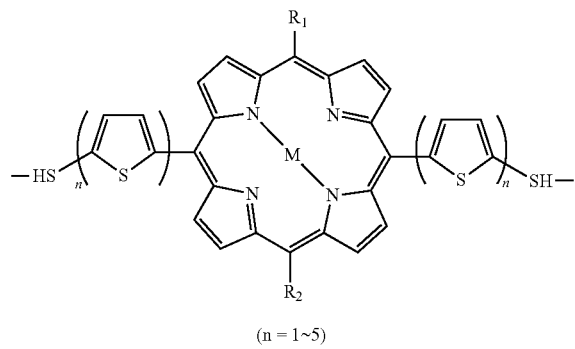

(n = 1~5)

(2)

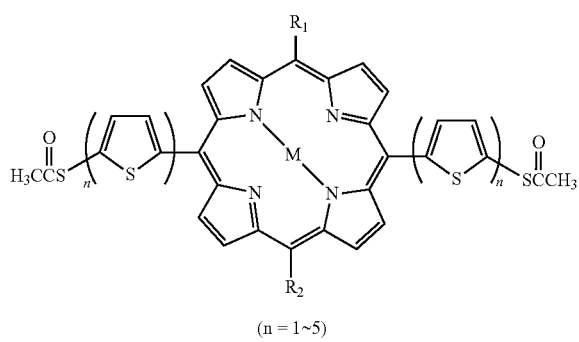

(n = 1~5)

The method for production of the organic electronic device of Example 1 will be described in the following.

[Step-100]

Porphyrin represented by the formulas (104) or (105) was synthesized from the starting substance of the following formula (103). Incidentally, in Example 1, the value of "n" in the porphyrin represented by the formulas (104) and (105) is "3". The porphyrin represented by the formula (104) (called porphyrin precursor in Example 1 for the sake of convenience) has thioacetyl groups (—SCOCH$_3$) at both terminals. On the other hand, the porphyrin represented by the formula (105) (called porphyrin precursor in Reference Example 1 for the sake of convenience) has a thioacetyl group at one terminal only. Here, the structural formula (104) is derived from the structural formula (1), with $R_1$ and $R_2$ representing alkyl groups ($C_5H_{11}$) and M representing $Zn^{+2}$ and n assuming 3. The detail of the synthesis of the porphyrin represented by the formulas (104) and (105) will be mentioned later.

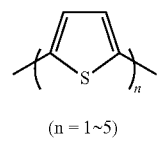

(103)

(n = 1~5)

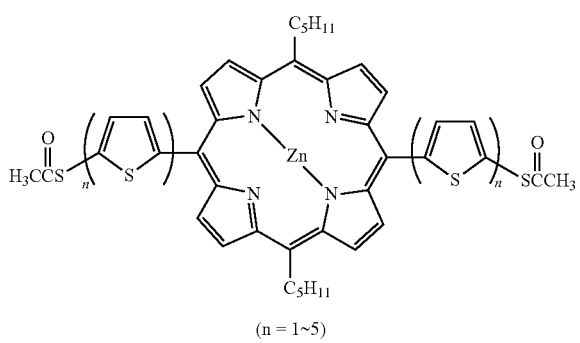

(104)

(n = 1~5)

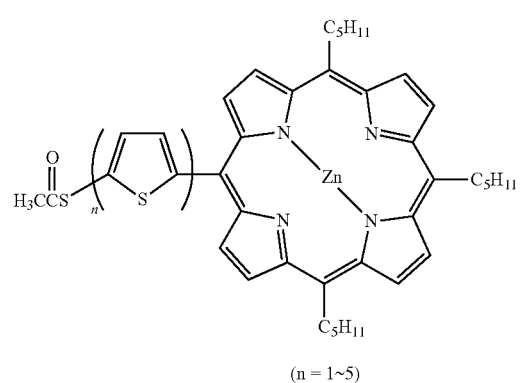

(105)

(n = 1~5)

Figure 3:
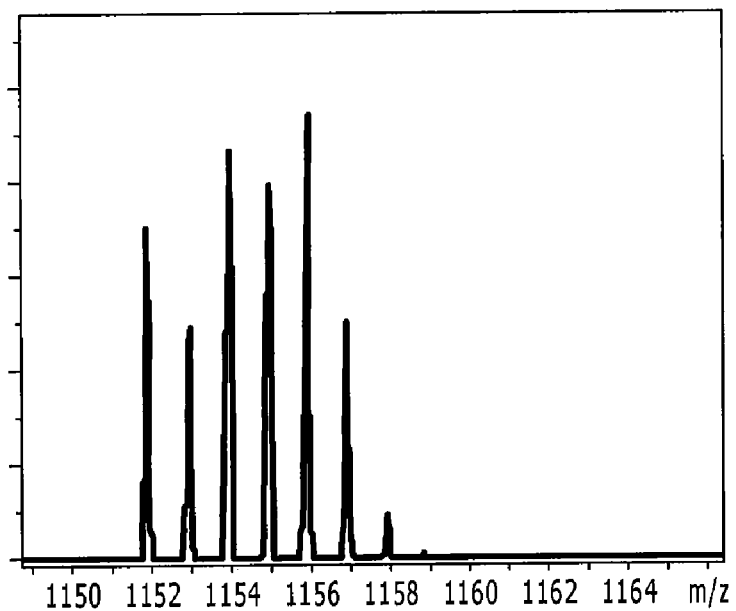
FIG. 3 is a graph showing the molecular weight (measured by MALDI-TOF-MS) of porphyrin represented by the formula (104), which is the first organic semiconductor molecule in Example 1.
Figure 4:
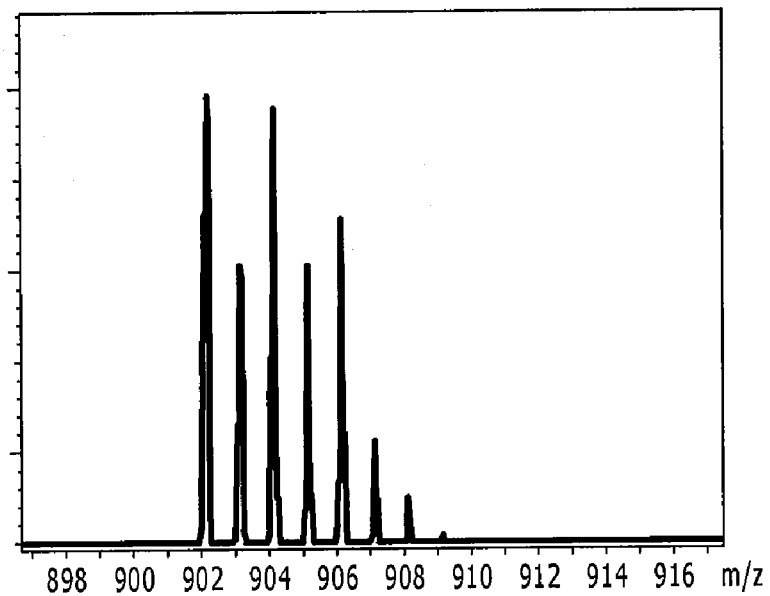
FIG. 4 is a graph showing the molecular weight (measured by MALDI-TOF-MS) of porphyrin represented by the formula (105) in Reference Example 1.

Upon measurement by MALDI-TOF-MS of the molecular weight of the porphyrin precursor of Example 1 and Reference Example 1 represented by the formulas (104) and (105), the result was 1151.881 and 902.158, respectively, which agree with the calculated values (1152.083 and 902.216, respectively) as shown in FIGS. 3 and 4.

In the case where the conductive path is formed based on the porphyrin precursor of Example 1 and Reference Example 1 shown in the formulas (104) and (105), it is necessary that the thioacetyl group at the terminal of the molecule immediately before the formation of the conductive path be substituted with the thiol group (—SH). It is desirable that since the porphyrin with the terminal substituted with the thiol group is easily oxidized in the air, the terminal should be left in the form of thioacetyl group immediately before use. This substitution with the thiol was carried out according to the method described in X. Xiao et al., J. Am. Chem. Soc. 2005, 127, 9235-9240. That is, since both terminals of these molecules are acetyl groups, hydrolysis reaction was carried out immediately before chemical bonding of fine particles with the organic semiconductor molecules and both terminals of these compound were made into thiol groups. Specifically, after the porphyrin was added to ethanol (at this point, the porphyrin does not dissolve in ethanol), 50 mL of 0.2 N NaOH aqueous solution was added and, after stirring for 30 minutes, it became a clear green solution. The concentration of the porphyrin solution is one mmol and in the argon saturated state.

Using the thus prepared porphyrin solution of Example 1 and Reference Example 1, a trial product of the organic electronic device was produced according to the method explained in the following.

[Step-110]

Using a silicon semiconductor substrate with impurities doped in high concentrations as the support, using this silicon semiconductor substrate itself as the gate electrode, the gate insulating film (corresponding to the substrate) was constituted from $SiO_2$ formed by thermal oxidation of the surface of this silicon semiconductor substrate. And, on the gate insulating film, a titanium (Ti) layer of thickness of about 0.5 nm as the adhesion layer and a gold (Au) layer of thickness of about 25 nm as the source/drain electrode were sequentially formed by vacuum deposition. At the time of film formation of these layers, by covering part of the gate insulating layer with a hard mask, it was possible to form the source/drain electrodes without photolithography process.

[Step-120]

Figure 2A:
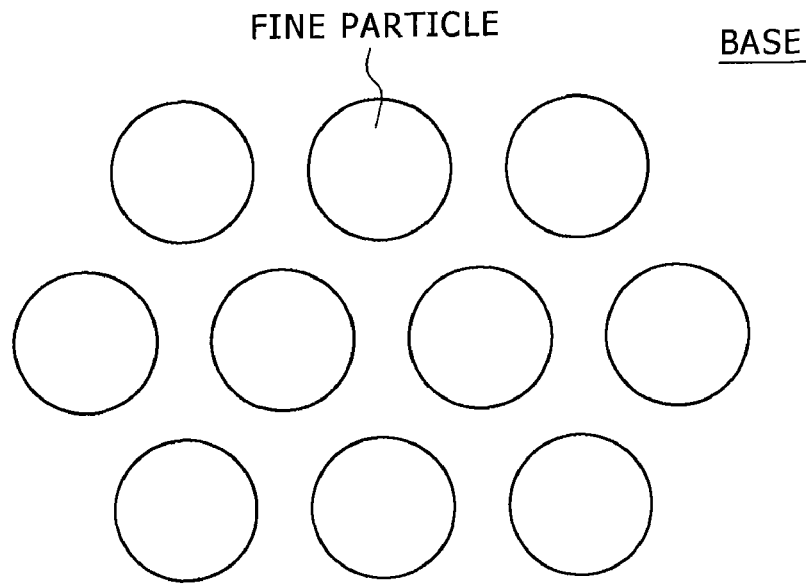
FIGS. 2A and 2B are schematic diagrams illustrating how the conductive path is formed to construct the organic electronic device pertaining to an embodiment.

Then, after a thin film was formed on the water surface based on a toluene solution containing Au fine particles according to the method similar to LB method, the solvent contained in the thin film was evaporated, thereby the film of fine particles thus formed was transferred to the substrate (specifically, on the source/drain electrodes and the gate insulating film), and thus the monolayer of film of fine particles layer was obtained. This state is schematically shown in FIG. 2A. FIG. 2A shows as if fine particles are arranged scatteredly; in practice, however, they are arranged two-dimensionally regularly within the plain approximately parallel to the surface of the substrate in the packed state (specifically, in the closest packing state) in such a state that the protective film (not shown) formed on the surface of fine particles is in contact.

[Step-130]

Figure 2B:
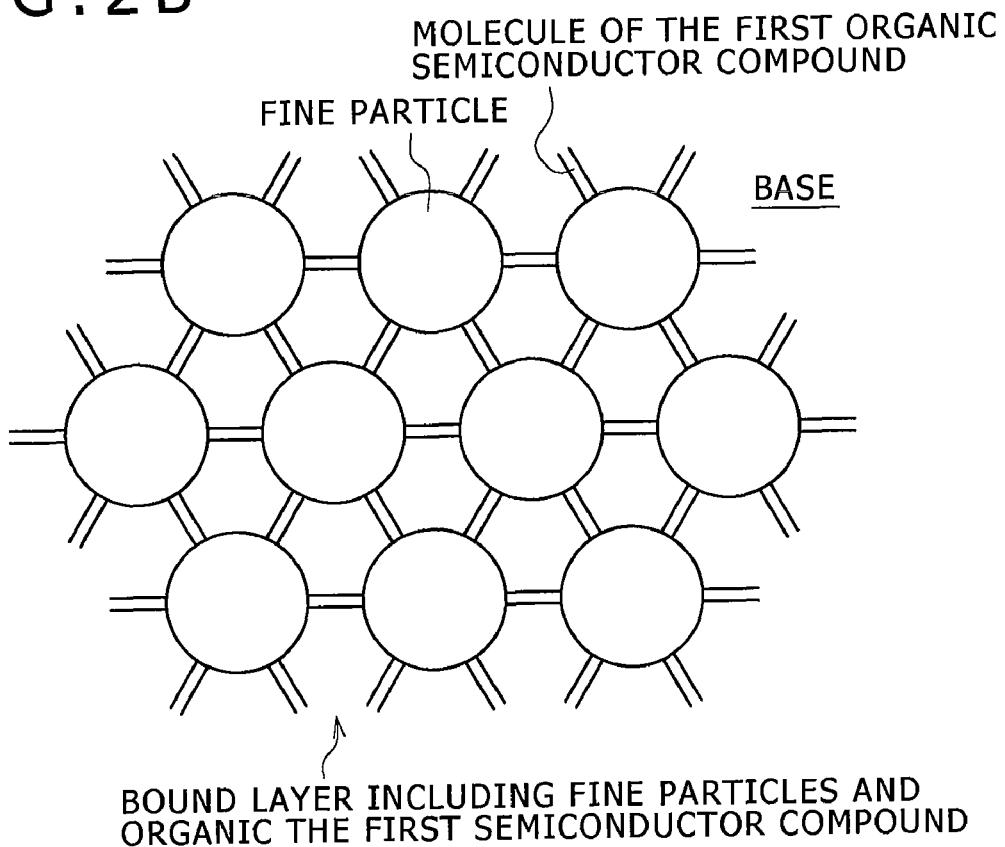

After that, the whole was dipped in the porphyrin solution mentioned above. As the result that the porphyrin which is the first organic semiconductor molecule or the first organic semiconductor molecule is substituted by the organic compound constituting the protective film, the chemically bound body of fine particles with the first organic semiconductor molecule is formed (see the conceptual drawing of FIG. 2B). Thus it was possible to be formed on the substrate a bound layer of fine particles and the first organic semiconductor molecule (porphyrin network monolayer film) which is composed of:

(a) fine particles, and (b) the organic semiconductor molecule binding fine particles together having the first conductive type. Alternatively, it was possible to obtain on the substrate the conductive path including:

(A) fine particles, and (B) an organic semiconductor molecule joining fine particles together, and it behaves as p-type.

With the foregoing steps, the method for production of the organic electronic device according to the second embodiment is completed, and it is possible to obtain the organic electronic device pertaining to the second embodiment. And, in order to obtain the organic electronic device pertaining to the first embodiment, the method for production of the organic electronic device pertaining to the first embodiment, which is explained in the following, is further implemented.

[Step-140]

That is, then, the bound layer of fine particles and the first organic semiconductor molecule was brought into contact with the second organic semiconductor molecule having the second conductive type. Specifically, the whole was dipped in a toluene solution of fullerene ($C_{60}$). By this, fullerene ($C_{60}$) is taken into the molecule recognition site (network space) and it was possible to obtain the conductive path (see FIG. 1A).

Incidentally, regarding the formation of the composite body of porphyrin and fullerene by π-π mutual action, there are known the reports on capture of $C_{60}$ by porphyrin cycle dimer (K. Tashiro et al., J. Am. Chem. Soc. 1999, 121, 9477-9478), capture of $C_{60}$ by porphyrin gel (M. Shiragawa et al., J. Am. Chem. Soc. 2003, 125, 9902-9903), and porphyrin/$C_{60}$ composite body on the surface of gold nano particles (H. Imahori et al., Chem. Eur. J. 2005, 11, 7265-7275).

Figure 5:
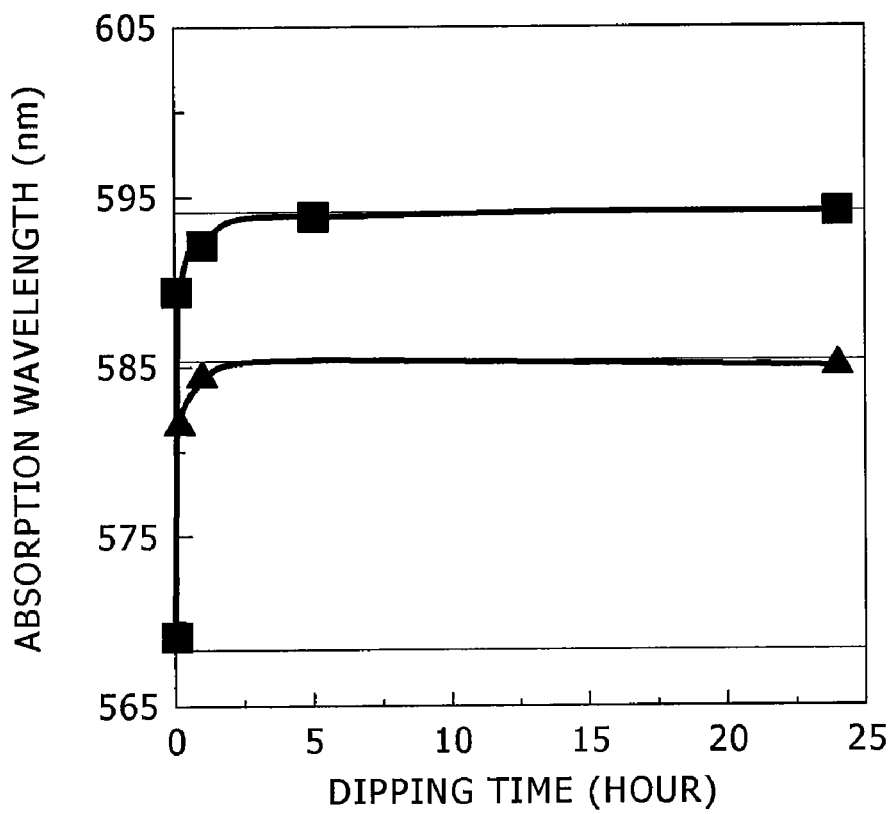
FIG. 5 is a graph showing the absorption spectrum of plasmon in the porphyrin network film.

Here, the test to confirm that the porphyrin which is the first organic semiconductor molecule is substituted by the organic compound constituting the protective film was carried out by dipping the whole in the porphyrin solution. Specifically, the change in UV-Vis absorption spectrum on the glass substrate was examined. First, a glass substrate, measuring 1.8 cm by 1.8 cm, underwent sequentially ultrasonic cleaning with ethanol, ultrasonic cleaning with acetone, and ultrasonic cleaning with pure water. A monolayer film of gold fine particle was formed on the glass substrate based on the method similar to LB method in the same way as mentioned above. And, simply by dipping the glass substrate in the porphyrin solution, the porphyrin-network film was formed on the glass substrate. Measurement of the plasmon absorption spectrum in this porphyrin-network film was carried out. Incidentally, the shift of the plasmon absorption peak of the gold nano fine particles by the dipping time was monitored. The dipping time was zero minute, ten minutes, one hour, five hours, and 24 hours. The results are shown in FIG. 5. The graph shown with black squares in FIG. 5 is the result when the porphyrin solution of Example 1 was used, and the graph shown with black triangles is the result when the porphyrin solution of Reference Example 1 was used.

It is known that in the plasmon absorption of gold, the long wavelength shift occurs due to:

(1) mutual action of gold nano particles and the first organic semiconductor molecule, and (2) mutual action among gold nano particles.

(See, for example, B. C. Sih et al., Chem. Commun. 2005, 3375-3384.) In the case where the porphyrin solution of Example 1 was used, the shift of the plasmon becomes almost saturate within one hour of dipping time, the shift of the plasmon absorption as great as 25 nm was observed. Also, the shift saturation was observed within about initial one hour, and the formation of Au—S bonding was strongly suggested. In the case where the porphyrin solution of Reference Example 1 incapable linking among particles, the total shift amount of plasmon is 15 nm, and it is smaller than the case in which the porphyrin solution of Example 1 was used. It is understood from this result that strong mutual actions take place due to linking between gold nano fine particles and the first organic semiconductor molecule and the shift of the plasmon absorption becomes large.

Figure 6:
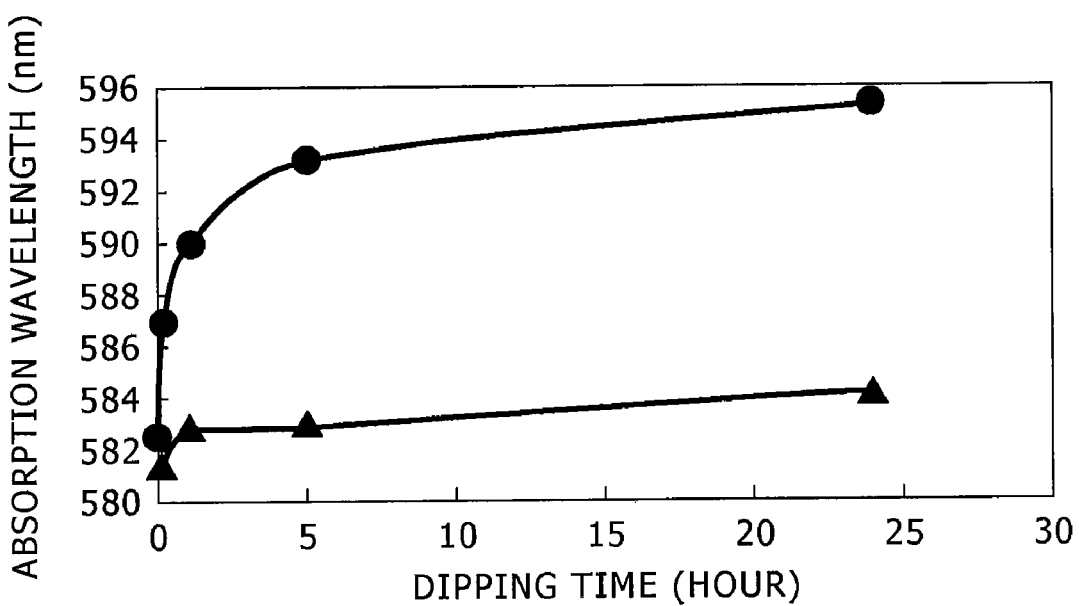
FIG. 6 is a graph showing the shift of the plasmon absorption which was monitored after dipping in a toluene solution of fullerene (C$_{60}$) for a certain period of time.

Also, the thus obtained sample was dipped for a certain period of time in a toluene solution of fullerene ($C_{60}$) and the shift of the plasmon absorption was monitored. The dipping time was zero minute, ten minutes, one hour, five hours, and 24 hours. The results are shown in FIG. 6. The graph shown with black squares in FIG. 6 is the result when the porphyrin solution of Example 1 was used, and the graph shown with black triangles is the result when the porphyrin solution of Reference Example 1 was used. The porphyrin molecule solution from which the result of FIG. 5 was obtained differs in production lot from the porphyrin solution from which the result of FIG. 6 was obtained. By allowing the fullerene ($C_{60}$) to be captured in the molecule recognition site (network space), the long wavelength shift of plasmon is observed. In this case, too, the saturation of shift was observed within several hours. Here, about 10 nm larger shift occurs in the case where the porphyrin solution of Example 1 was used than in the case where the porphyrin solution of Reference Example 1 was used, and it was understood that selective capture of fullerene ($C_{60}$) by the network structure occurs. From the foregoing result, the linker action by the porphyrin and the capture action of fullerene ($C_{60}$) by the network structure has been elucidated.

Figure 7A:
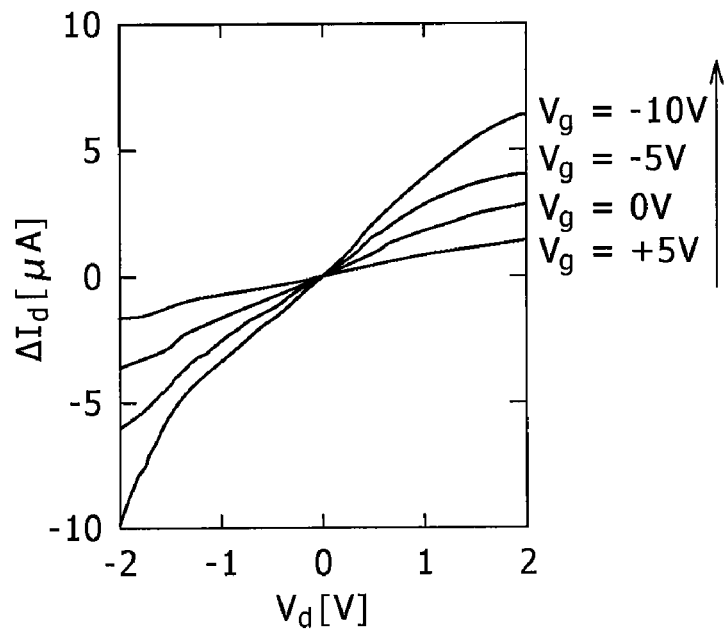
FIGS. 7A and 7B are graphs showing how Samples A and B in Example 1 vary in drain current.
Figure 7B:
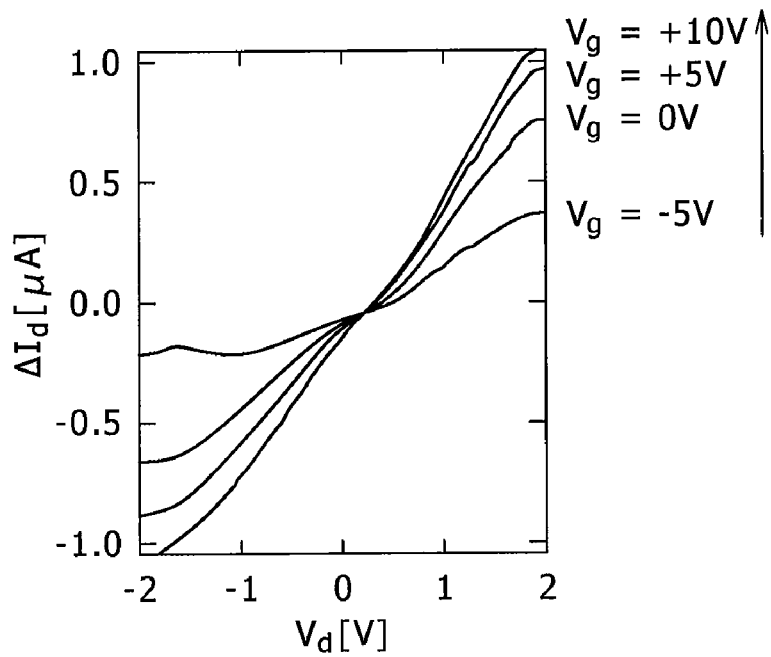
Figure 10:
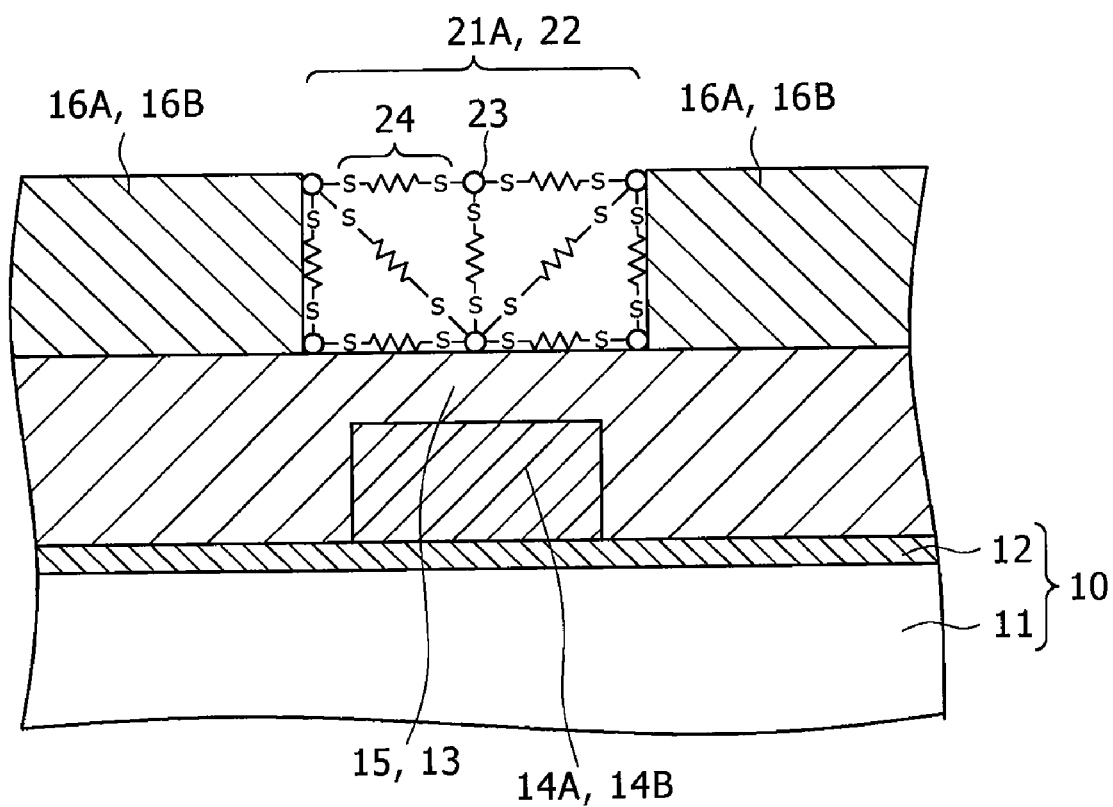
FIG. 10 is a schematic diagram showing part of the organic electronic device (field effect transistor) in Example 3.

Evaluation of the characteristic properties of the above-mentioned conductive path was carried out. Specifically, the drain current was measured in sample-A (corresponding to the organic electric device pertaining to the second embodiment) which was obtained by completion of [Step-130] and sample-B (corresponding to the organic electronic device pertaining to the first embodiment) obtained by completion of [Step-140] which is dipping in toluene solution of fullerene ($C_{60}$) for one hour. The result of measurement of sample-A is shown in FIG. 7A, and the result of measurement of sample-B is shown in FIG. 7B. It is apparent from FIG. 7A that sample-A works as a transistor of p-channel type as evidenced by the fact that the drain current increases as the gate voltage $V_g$ is switched to negative. It is also apparent from FIG. 7B that sample-B works as a transistor of n-channel type as evidenced by the fact that the drain current (absolute value) increases as the gate voltage $V_g$ is switched to positive. The foregoing results in Example 1 suggest that the host-guest mutual action is possible and the transistor of p-channel type can be converted into the transistor of n-channel type as the second organic semiconductor molecule (which is the guest molecule) is easily taken up.

EXAMPLE 2

Example 2 is a modification of Example 1. In Example 2, a trial product of the organic electronic device was produced according to the method explained in the following by using the porphyrin solution based on the organic semiconductor molecule of the formula (104) in which n=2. At the same time, in Reference Example 2, a trial product of the organic electronic device was produced according to the method explained in the following by using the porphyrin solution based on the organic semiconductor molecule of the formula (105) in which n=2. Incidentally, since these compounds have acetyl groups at both terminals thereof, hydrolysis was carried out immediately before chemical bonding of fine particles with the organic semiconductor molecule, so that both terminals were changed into thiol groups. Specifically, after the porphyrin is added to ethanol (at this point, the porphyrin does not dissolve in ethanol), 50 mL of 0.2 N NaOH aqueous solution is added and stirred for 30 minutes, it turns into a clear green solution. The concentration of the porphyrin solution was 0.1 mmol and 0.5 mmol. Incidentally, it is argon saturated state.

[Step-210]

The same procedure as in Example 1 was repeated, by using as the support a silicon semiconductor substrate with impurities doped in high concentrations and using this silicon semiconductor substrate itself as the gate electrode, to form the gate insulating film (corresponding to the substrate) from $SiO_2$ (150 nm thick) which resulted from thermal oxidation of the surface of the silicon semiconductor substrate. And, on the gate insulating layer, a chromium (Cr) layer as the adhesion layer and an about 25 nm thick gold (Au) layer as the source/drain electrode were sequentially formed according to the vacuum deposition method. When these layers are formed, the gate insulating layer partly covered with a hard mask, so that the source/drain electrodes were formed without photolithography process. Incidentally, the channel length and width were 50 μm and 8.8 mm.

[Step-220]

A thin film of gold fine particles (with a mean particle size $R_{AVE}$=4.7±1.1 nm) was formed on the water surface from a toluene solution containing them by the method similar to the LB method. With solvent removed by evaporation, the resulting thin film was transferred to the substrate (specifically the source-drain electrodes and the gate insulating layer). Thus there was obtained the monolayer of fine particles which is identical with that schematically shown in FIG. 2A.

[Step-230]

After that, the whole was dipped in the above-mentioned porphyrin solution (temperature: 50° C.) for three hours. As the result that the porphyrin, which is the organic semiconductor molecule, is substituted by the organic molecules constituting the protective film, the chemically bound body of fine particles and the organic semiconductor molecule was formed (see the conceptual drawing of FIG. 1B). In this way, it was possible to obtain on the substrate the conductive path including:

(A) the fine particles, and (B) the organic semiconductor molecule binding fine particles together, and which behaves as p-type.

With the foregoing steps, the method for production of the organic electronic device pertaining to the second embodiment is completed, and it was possible to obtain the organic electronic device pertaining to the second embodiment.

[Step-240]

After that, the bound layer was brought into contact with the second organic semiconductor molecule which have the second conductive type and (specifically) the whole was dipped in a toluene solution of fullerene ($C_{60}$). By this, fullerene ($C_{60}$) is taken into the molecule recognition site (network space) and it was possible to obtain the conductive path (see FIG. 1A).

The organic electronic device pertaining to the second embodiment (or the sample of Example 2 and Reference Example 2) obtained by [Step-230] was tested for electric characteristics. The current-voltage characteristics were measured by using two to four samples. The results (average values) of measurement of the conductivity (σ) and mutual conductance ($g_m$) of Example 2 and Reference Example 2 are shown below.

Conductivity σ Mutual conductance $g_m$/W
(S/cm) (S/cm)

EXAMPLE 2

0.1 mmol 7.71×10⁻² 1.83×10⁻⁵
0.5 mmol 5.70×10⁻² 8.54×10⁻⁶

REFERENCE EXAMPLE 2

0.1 mmol 5.82×10⁻⁴ 8.43×10⁻⁸
0.5 mmol 1.23×10⁻⁴ 8.89×10⁻⁹

Example 2 demonstrating the organic electronic device pertaining to the second embodiment is characterized by conductivity σ and mutual conductance which are about $10^2$ times larger and bout $10^3$ times larger, respectively, than Reference Example 2. The absence of linking between gold fine particles in Reference Example 2 is the reason for the intermolecular hopping making the conductive path. On the other hand, the linking between fine particles that occurs in Example 2 results in a large current value due to contribution from intramolecular conduction. Moreover, the fact that Example 2 gave a relatively high mutual conductance $g_m$ suggests that a more significant gate effect will be obtained if a network is formed among gold nano particles. It was also shown that the organic electronic device with dithiol porphyrin linker is superior to the organic electronic device with mono-thiol porphyrin linker in characteristic properties (conductivity and gate effect).

EXAMPLE 3

Example 3 is a modification of Example 1. The organic electronic device in Example 3 is a field effect transistor (FET) or, specifically, a thin-film transistor (TFT). The field effect transistor (specifically, thin-film transistor) of Example 3 has the conductive path which constitutes the channel-forming region that behaves as the second conductive type. Moreover, the field effect transistor (specifically, n-channel type TFT) of Example 3 is that of bottom gate/bottom contact type. As schematically shown in FIG. 9B, which is a partial sectional view, it is composed of:

(A) a gate electrode 14B formed on a support 10, (B) a gate insulating layer 15 (corresponding to the substrate 13) formed on the gate electrode 14B and the support 10, (C) source/drain electrodes 16A formed on the gate insulating layer 15, and (D) a channel forming region 17B which is between the source/drain electrodes 16B and formed on the gate insulating layer 15 and constructed of the conductive path 21B.

The field effect transistor of Example 3 (specifically, p-channel TFT) is that of bottom gat/bottom contact type. As schematically shown in FIG. 9B, which is a partial sectional view, it is composed of:

(A) a gate electrode 14A formed on a support 10, (B) a gate insulating layer 15 (corresponding to the substrate 13) formed on the gate electrode 14A and the support 10, (C) source/drain electrodes 16A formed on the gate insulating layer 15, and (D) a channel forming region 17A which is between the source/drain electrodes 16A and formed on the gate insulating layer 15 and constructed of the conductive path 21A.

The channel forming regions 17A and 17B in Example 3 and Examples 4 to 6 mentioned later have the same structure as the conductive path explained in Example 1. They may be formed basically in the same way as explained in Example 1.

Example 3 is identical with Example 1 in that the fine particles 23 as a conductor are gold nano particles having a mean particle size $R_{AVE}$ of 5 nm, and that the first organic semiconductor molecule is porphyrin of p-conductive type having thiol groups (—SH) on its both terminals and the second organic semiconductor molecule is fullerene ($C_{60}$) of n-conductive type. The support 10 is a glass substrate 11 having an insulating layer 12 of $SiO_2$ formed on the surface thereof, and the substrate 13 is the gate insulating layer 15 (specifically, $SiO_2$).

The following is a general description of the method for production of the organic electronic device (field effect transistor) of Example 3, in reference to FIGS. 8A and 8B, FIGS. 9A and 9B, and FIG. 10, which are schematic partial sectional views showing the substrate.

[Step-300]

On the support 10 are formed the gate electrodes 14A and 14B. Specifically, the insulating layer 12 of $SiO_2$ formed on the glass substrate 11 is coated by lithography with a resist layer (not shown) which is partly left open in the area where the gate electrodes 14A and 14B are to be formed. The entire surface is coated sequentially with a titanium (Ti) layer (not shown) as an adhesion layer and a gold (Au) layer as the gate electrodes 14A and 14B by vacuum deposition. Finally, the resist layer is removed. In this way, the gate electrodes 14A and 15A are formed by the lift-off method.

[Step-310]

The support 10 including the gate electrodes 14A and 14B (specifically, the insulating layer 12 formed on the glass substrate 11) is coated with the gate insulating layer 15 corresponding to the substrate 13. Specifically, the gate insulating layer 15 of $SiO_2$ is formed by sputtering on the gate electrodes 14A and 14B and the insulating layer 12. When the gate insulating layer 15 is formed, the gate electrodes 14A and 14B are partly covered with a hard mask, so that the leads (not shown) of the gate electrodes 14A and 14B can be formed without lithography process.

[Step-320]

The gate insulating layer 15 is coated with a gold (Au) layer for the source/drain electrodes 16A and 16B (See FIG. 8A). Specifically, this step includes sequentially forming by vacuum deposition a titanium (Ti) layer (not shown), about 0.5 nm thick, as an adhesion layer, and a gold (Au) layer, about 25 nm thick, as the source/drain electrodes 16A and 16B. When these layers are formed, the gate insulating layer 15 is partly covered with a hard mask, so that the source/drain electrodes 16A and 16B can be formed without lithography process.

[Step-330]

The substrate 13 is coated with the layer 20 of fine particles composed of the fine particles 23 (See FIG. 8B). Specifically, the layer 20 of fine particles composed of the fine particles 23 is formed in the same way as [Step-120] of Example 1 on the gate insulating layer 15 and the source/drain electrodes 16A and 16B.

[Step-340]

The whole is dipped in a solution of porphyrin in the same way as in Step-130 of Example 1. The porphyrin as the first organic semiconductor molecule replaces the organic compound constituting the protective film, and this results in a chemically bound body composed of the fine particles 23 and the first organic semiconductor molecule 24 (See FIG. 10). Thus, this step covers the substrate 13 (or the gate insulating layer 15) with the bound layer 22 (or the porphyrin network single layer) for n-channel type TFT which is composed of, as shown in FIG. 9A, (a) the fine particles 23, and (b) the first organic semiconductor molecule which has the first conductive type and which binds the fine particles 23 together.

In this way, there is obtained the p-channel type TFT (corresponding to the organic electronic device pertaining to the second embodiment) which is composed of:

(A) the gate electrode 14A formed on the support 10, (B) the gate insulating layer 15 (corresponding to the substrate 13) formed on the gate electrode 14 and the support 10, (C) the source/drain electrodes 16A formed on the gate insulating layer 15, and (D) the channel forming region 17A constructed of the conductive path 21A of the first conductive type (p-type) which is between the source/drain electrodes 16A and is formed on the gate insulating layer 15.

[Step-350]

The p-channel TFTs except for those p-channel TFTs to be converted into n-channel TFTs are coated with a mask layer 30 of hydrophobic polymer such as polyvinyl chloride (PVC), polyethylene (PE), and polypropylene (PP). The bound layer 22 is brought into contact with the second organic semiconductor molecule having the second conductive type in the same way as [Step-140] in Example 1. Specifically, the whole is dipped in a toluene solution of fullerene ($C_{60}$). In this way, fullerene ($C_{60}$) is taken into the molecule recognition site (network space), and the conductive path 21B can be obtained. Thus the channel forming region 17B is formed which is between the source/drain electrodes 16B and is formed on the gate insulating layer 15 and is constructed of the conductive path 21B, and there is obtained the n-channel type TFT (corresponding to the organic electronic device pertaining to the first embodiment) (See FIG. 9B).

[Step-360]

Finally, a passivation film (not shown) is formed on the entire surface, thereby giving the FET (specifically TFT) of bottom gate/bottom contact type.

In [Step-330], the phenomenon of self-organization of the fine particles 23 themselves is positively utilized to achieve the two-dimensional regular arrangement. Specifically, the layer 20 of fine particles is formed by the method which includes spreading a solution of fine particles 23 (or a colloidal solution of fine particles) on a hydrophilic solvent (such as water), thereby making a monolayer of two-dimensionally regularly arranged gold nano particles with a hydrophobic surface on the surface thereof Alternatively, the method includes spreading a monolayer of two-dimensionally regularly arranged gold nano particles with a hydrophilic surface on a hydrophobic solvent, and transferring it onto the substrate 13 in a way similar to the LB method. The method for forming the layer 20 of fine particles is not limited to this. It is also possible to form the layer 20 of fine particles by, for example, the casting method.

In [Step-340], the first organic semiconductor molecule 24 has its functional groups chemically bind with the fine particles 23. Specifically, the first organic semiconductor molecule 24 chemically (mutually) binds with the fine particles 23 to constitute the network conductive paths 21A and 21B. The first organic semiconductor molecule 24 has its both functional groups substituted (in Example 3, the first organic semiconductor molecule having the conjugate bond, and the porphyrin represented by the formula (104) has its both terminals substituted with thiol group [—SH]). Here, the monolayer of the bound body of the fine particles 23 and the first organic semiconductor molecule 24 constitutes the conductive paths 21A and 21B, or the laminate structure of the bound body of the fine particles 23 and the first organic semiconductor molecule 24 constitute the conductive paths 21A and 21B. In other words, the monolayer of the bound body of the fine particles 23 and the first organic semiconductor molecule 24 can be formed by performing once the step of arranging the fine particles 23 in the close packed state two-dimensionally regularly in the plane approximately parallel to the surface of the substrate 13 and bringing it into contact with the first organic semiconductor molecule, or by repeating the step twice or more. The layers of the bound body of the fine particles 23 and the first organic semiconductor molecule 24 can be laminated and the laminate structure of the bound body can be obtained. Alternatively, by repeating the step of forming the layer 20 of fine particles several times, arranging the fine particles 23 three-dimensionally regularly arranged in the close packed state, and performing at least once the step of bringing the first organic semiconductor molecule 24 into contact, it is possible to obtain the laminate structure of the bound body in which the layers of bound body of the fine particles 23 and the first organic semiconductor molecule 24 are laminated. In this way, by forming the layer 20 of the fine particles one by one, the channel forming regions 17A and 17B can be formed, and by repeating this step as many times as necessary to form the channel forming regions 17A and 17B of desired thickness. The thus eventually obtained channel forming regions 17A and 17B are constructed of the bound body in which the fine particles 23 and the first organic semiconductor molecule 24 are bound in a network state, and the carrier transfer is controlled by the gate voltage applied to the gate electrodes 14A and 14B.

Incidentally, in the channel forming regions 17A and 17B, the fine particles 23 are two-dimensionally or three-dimensionally bound by the first organic semiconductor molecule 24 and the network conductive paths 21A and 21B are formed. In these conductive paths 21A and 21B, electron transfer among molecules, which was the cause of low mobility in the channel forming region of the organic semiconductor molecule in related art, is not contained, and yet electron transfer in the molecule is performed through the conjugated system formed along the molecular skeleton, and hence high mobility is expected. The electron conduction in the channel forming regions 17A and 17B is performed through the network conductive paths 21A and 21B and the conductivity of the channel forming regions 17A and 17B is controlled by gate voltage applied to the gate electrodes 14A and 14B.

Alternatively, in the same step as [Step-330] and [Step-340], 200 mg of powdery BPDT is placed in 10 mL of toluene solution diluted 200 times with toluene from the stock toluene solution containing 30wt % of gold nano particles, and mixing, so that the gold particles react with BPDT in a short time, and the three-dimensional network cluster composed of the fine particles 23 and the first organic semiconductor molecule is formed, and it separates out as precipitates at the bottom of the solution. That is, the functional group of the first organic semiconductor compound (the first organic semiconductor molecule having the conjugated bond and thiol group (—SH) possessed at both terminals of 4,4'-biphenyldithiol (BPDT)) chemically binds with the fine particles 23, specifically, the first organic semiconductor molecule chemically (alternately) binds with the fine particles 23 by the functional groups (thiol group) which the first organic semiconductor molecule has at its both terminals in a state of the three-dimensional network, so that the cluster is formed. The thus obtained cluster is applied over the entire surface and allowed for natural drying. In this way, it is also possible to form the bound layer 22 composed of fine particles and the first organic semiconductor molecule 22 and the conductive path 21A can be obtained.

EXAMPLE 4

Example 4 is a modification of Example 1. In Example 4, the organic electronic device is an FET (specifically TFT) of bottom gate/top contact type. As schematically shown in FIG. 12B, which is a partial sectional view, the field effect transistor (specifically, TFT of n-channel type) of Example 4 is composed of:

(A) a gate electrode 14B formed on a support 10, (B) a gate insulating layer 15 (corresponding to the substrate 13) formed on the gate electrode 14B and the support 10, (C) the layer 18B constituting the channel forming region 17B which is formed on the gate insulating layer 15 and constructed of the conductive path 21B, and (D) source/drain electrodes 16B formed on the layer 18B constituting the channel forming region. Alternatively, as schematically shown in FIG. 12B, which is a partial sectional view, the field effect transistor (specifically, TFT of p-channel type) of Example 4 is composed of:

(A) a gate electrode 14A formed on a support 10, (B) a gate insulating layer 15 (corresponding to the substrate 13) formed on the gate electrode 14A and the support 10, (C) the layer 18A constituting the channel forming region 17A which is formed on the gate insulating layer 15 and includes the channel forming region 17A constructed of the conductive path 21A, and (D) the source/drain electrodes 16A formed on the layer 18A constituting the channel forming region.

The following is a general description of the method for production of the organic electronic device (field effect transistor) of Example 4, in reference to FIGS. 11A and 11B and FIGS. 12A and 12B, which are schematic partial sectional views showing the substrate.

[Step-400]

First, in the same way as [Step-300] in Example 3, the gate electrodes 14A and 14B are formed on the support 10 and then, in the same way as [Step-310] in Example 3, the gate insulating layer 15 corresponding to the substrate 13 is formed on the support (specifically, the insulating layer 12) including the gate electrodes 14A and 14B.

[Step-410]

Then, in the same way as [Step-330], the layer 20 of the fine particles 23 is formed on the substrate 13 (See FIG. 11A). Moreover, by executing the same step as [Ste-340] in Example 3, the channel forming region constituting layer 18A including the channel forming region 17A can be formed. At the same time, the bound layer 22 to form the n-channel type TFT can be formed (See FIG. 11B). Incidentally, the bound layer 22 corresponds also to the channel forming region constituting layer 18B.

[Step-420]

After that, on the channel region forming region constituting layer 18A for the p-channel type TFT, the source/drain electrodes 16A are formed in such a way as to hold the channel forming region 17A. At the same time, on the region of the part of the channel forming region constituting layer 18B for the n-channel type TFT, the source/drain electrodes 16B for the n-channel type TFT is formed in such a way as to hold this part (See FIG. 12A). Specifically, in the same way as [Step-320] in Example 2, the titanium (Ti) layer (not shown) as an adhesion layer, and a gold (Au) layer as the source/drain electrodes 16A and 16B are sequentially formed by vacuum deposition. When film formation of these layers is carried out, part of the channel forming region constituting layers 18A and 18B is covered with a hard mask, so that the source/drain electrodes 16A and 16B can be formed without photolithography process. In this way, the p-channel type TFT can be obtained.

[Step-430]

Then, in the same way as [Step-350], the p-channel type TFT other than the p-channel type TFT to be converted into the n-channel type TFT is covered with the mask layer 30. In the same way as [Step-140] in Example 1, the bound layer 22 (porphyrin network monolayer film) constituting the exposed channel forming region constituting layer 18B is brought into contact with the second organic semiconductor molecule having the second conductive type. Specifically, the whole is dipped in a toluene solution of fullerene ($C_{60}$). In this way, the fullerene ($C_{60}$) is taken into the molecule recognition site (network space) and the conductive path 21 B can be obtained. In this way, the channel forming region 17B which is between the source/drain electrodes 16B and formed on the gate insulating layer 15 and constructed of the conductive path 21B can be obtained (See FIG. 12B).

[Step-440]

Finally, a passivation film (not shown) is formed on the entirely surface, so that the semiconductor device of Example 5 4 can be completed.

EXAMPLE 5

Example 5 is also a modification of Example 1. In Example 5, the organic electronic device is an FET of top gate/bottom contact type (specifically, TFT). As shown in FIG. 14B, which is a schematic partial sectional view, the field effect transistor (specifically, n-type TFT) of Example 5 is composed of:

(A) the source/drain electrodes 16B formed on the insulating layer 12 corresponding to the substrate 13, (B) the channel forming region 17B which is formed on the substrate 13 between the source/drain electrodes 16B and constructed of the conductive path 21B, (C) the gate insulating layer 15B which is formed on the source/drain electrode 16B and the channel forming region 17B, and (D) the gate electrode 14B formed on the gate insulating layer 15B. Alternatively, as shown in FIG. 14B, which is a schematic partial sectional view, the field effect transistor (specifically, TFT of p-channel type) of Example 5 is composed of:

(A) the source/drain electrodes 16A formed on the insulating layer 12 corresponding to the substrate 13, (B) the channel forming region 17A which is formed on the substrate 13 between the source/drain electrodes 16B and constructed of the conductive path 21A, (C) the gate insulating layer 15A which is formed on the source/drain electrode 16A and the channel forming region 17A, and (D) the gate electrode 14A formed on the gate insulating layer 15A.

The following is a general description of the method for production of the organic electronic device (field effect transistor) of Example 5, in reference to FIGS. 13A and 13B and FIGS. 14A and 14B, which are schematic partial sectional views showing the substrate.

[Step-500]

First, in the same way as [Step-320] in Example 3, the source/drain electrodes 16A and 16B are formed on the insulating film 12 corresponding to the substrate 13, and then in the same way as [Step-120] in Example 1, the layer 20 composed of the fine particles 23 is formed on the substrate 13 (specifically, the insulating layer 12) including the source/drain electrodes 16A and 16B (See FIG. 13A).

[Step-410]

Then, in the same way as [Step-130] in Example 1, the whole is dipped in the porphyrin solution of Example 1. As the result that the porphyrin as the first organic semiconductor molecule is substituted by the organic compound constituting the protective film, the chemical bound body of the fine particles 23 and the first organic semiconductor molecule 24 is formed, and it is possible to form the conductive path 21A (the channel forming region 17A) and the bound layer (porphyrin network monolayer film) 22 (See FIG. 13B).

[Step-520]

Then, the gate insulating film 15A for the p-channel type TFT is formed in the same way as [Step-310] of Example 3. After that, the gate electrode 14A is formed in the part of the gate insulating film 15A on the channel forming region 17A in the same way as [Step-300] of Example 3, so that the p-channel type TFT is obtained (See FIG. 14A). The p-channel type TFT is covered with the mask layer 30 in the same way as [Step-350] of Example 3.

[Step-530]

After that, in the same way as [Step-140] of Example 1, the exposed bound layer 22 is brought into contact with the second organic semiconductor molecule having the second conductive type. Specifically, the whole is dipped in a toluene solution of fullerene ($C_{60}$). In this way, the molecule recognition site (network space) is taken into fullerene ($C_{60}$) and the conductive path 21B can be obtained.

[Step-540]

Then, after the gate insulating layer 15B for the n-channel type TFT has been formed in the same way as [Step-310] of Example 3, the gate electrode 14B is formed on that part of the gate insulating layer 15 on the channel forming region 17B in the same way as [Step-300] of Example 3 (See FIG. 14B). In this way, the n-channel type TFT can be obtained.

[Step-550]

Finally, a passivation film (not shown) is formed on the entirely surface, so that the semiconductor device of Example 5 can be completed.

EXAMPLE 6

Example 6 is also a modification of Example 1. In Example 6, the organic electronic device is an FET (specifically, TFT) of top gate/top contact type. As shown in FIG. 16B, which is a schematic partial sectional view, the field effect transistor (specifically, n-channel type TFT) of Example 6 is composed of:

(A) the channel forming region constituting layer 18B which is formed on the insulating layer 12 corresponding to the substrate 13 and includes the channel forming region 17B constructed of the conductive path 21B, (B) the source/drain electrode 16B formed on the channel forming region constituting layer 18B, (C) the gate insulating layer 15B formed on the source/drain electrodes 16B and the channel forming region 17B, and (D) the gate electrode 14B formed on the gate insulating layer 15B. Alternatively, as shown in FIG. 16B, which is a schematic partial sectional view, the field effect transistor (specifically, p-channel type TFT) of Example 6 is composed of:

(A) the channel forming region constituting layer 18A which is formed on the insulating layer 12 corresponding to the substrate 13 and includes the channel forming region 17A constructed of the conductive path 21A, (B) the source/drain electrode 16A formed on the channel forming region constituting layer 18A, (C) the gate insulating layer 15A formed on the source/drain electrodes 16A and the channel forming region 17A, and (D) the gate electrode 14A formed on the gate insulating layer 15A.

The following is a general description of the method for production of the organic electronic device (field effect transistor) of Example 6, in reference to FIGS. 15A and 15B and FIGS. 16A and 16B, which are schematic partial sectional views showing the substrate.

[Step-600]

First, in the same way as [Step-120] of Example 1, the fine particle layer 20 of the fine particles 23 is formed on the substrate 13 (specifically, the insulating layer 12).

[Step-610]

Then, in the same way as [Step-130] of Example 1, the whole is dipped into the porphyrin solution of Example 1. As the result that the porphyrin as the first organic semiconductor molecule is substituted by the organic compound constituting the protective film, the chemical bound body of the fine particles 23 and the first organic semiconductor molecule 24 is formed, and it is possible to form the conductive path 21A (the channel forming region 17A) and the bound layer (porphyrin network monolayer film) 22 (See FIG. 15A). Incidentally, the conductive path 21A and the bound layer 22 correspond to the channel forming region constituting layers 18A and 18B.

[Step-620]

Then, in the same way as [Step-320] of Example 3, the source/drain electrodes 16A and 16B are formed on the channel forming region constituting layer 18A and 18B (See FIG. 15B).

[Step-630]

Then, the gate insulating layer 15A for the p-channel type TFT is formed in the same way as [Step-310] of Example 3. Then, the gate electrode 14A is formed at the part of the gate insulating layer 15A on the channel forming region 17A in the same way as [Step-300] of Example 3 to obtain the p-channel type TFT (See FIG. 16A). The p-channel type TFT is covered with the mask 30 in the same way as [Step-350] of Example 3.

[Step-640]

Then, in the same way as [Step-140], the exposed bound layer 22 is brought into contact with the second organic semiconductor molecule having the second conductive type. Specifically, the whole is dipped in a toluene solution of fullerene ($C_{60}$). In this way, fullerene ($C_{60}$) is taken into the molecule recognition site (network space) and it is possible to obtain the conductive path 21B.

[Step-650]

Then, the gate insulating film 15B for the n-channel type TFT is formed in the same way as [Step-310] of Example 3, and the gate electrode 14B is formed on the part of the gate insulating layer 15B on the channel forming region 17B in the same way as [Step-300] of Example 3. In this way, it is possible to obtain the n-channel type TFT.

[Ste-660]

Finally, a passivation film (not shown) is formed on the entirely surface, so that the semiconductor device of Example 6 can be completed.

EXAMPLE 7

Porphyrin is a cyclic conjugated compound with 18 electrons which is composed of four pyrrole rings. It forms a stable complex at its center with any of various metals such as zinc, ruthenium, cobalt, gold, magnesium, and iron. It is known that porphyrin in the form of aggregate brings about photoelectric conversion in natural photosynthesis. For instance, absorption of light by porphyrin excites electrons in the ground state, thereby generating stable excitons. This excitation energy moves among molecules very efficiently to transfer electrons to the reaction center, thereby bringing about photosynthesis.

Figure 17:
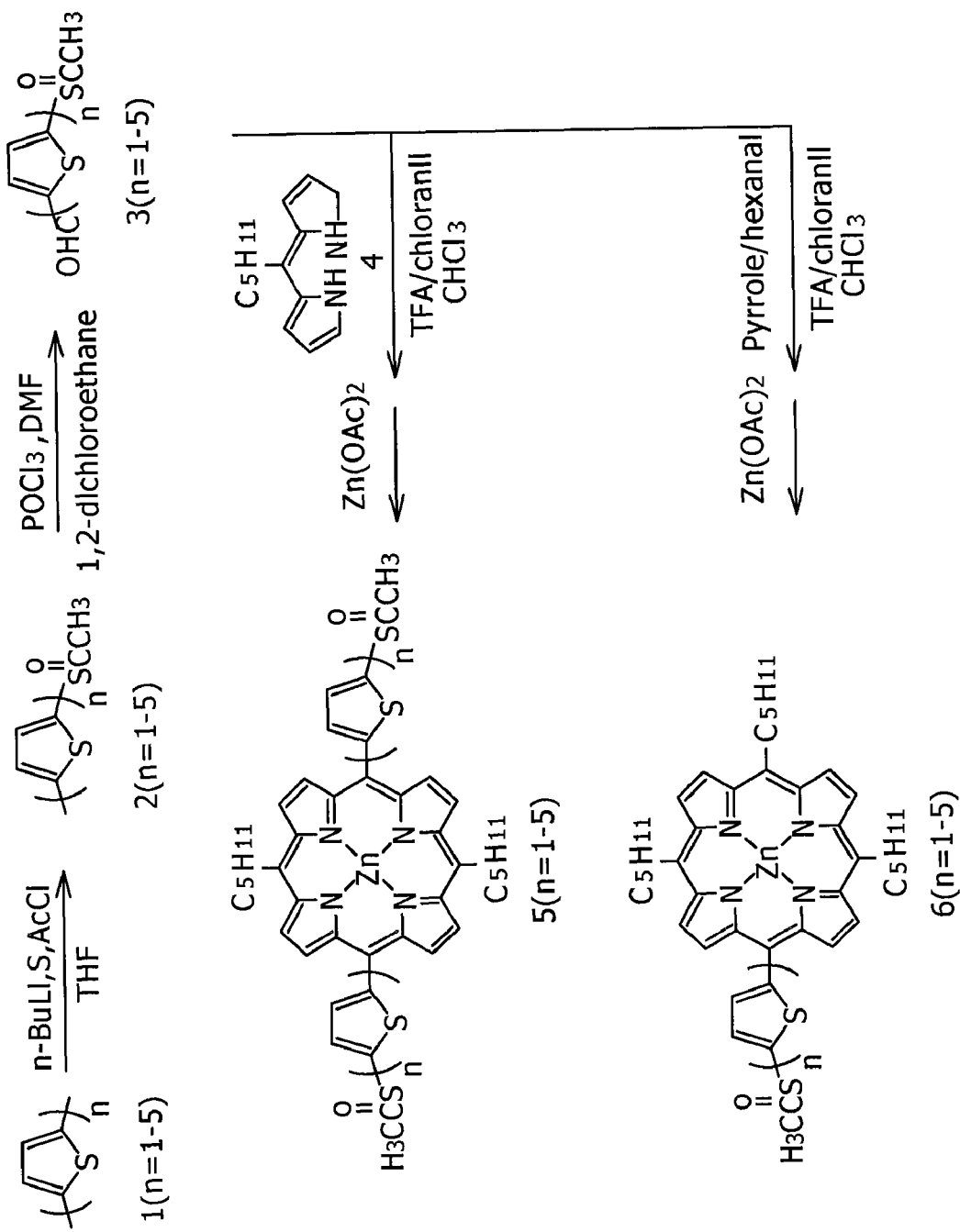
FIG. 17 is a diagram showing the scheme of synthesis of the organic semiconductor molecule which is represented by the formula (104) and the organic semiconductor molecule of Reference Example which is represented by the formula (105)

The organic semiconductor molecule according to the embodiment, which is represented by the formula (104), is a porphyrin derivative (compound 5 shown in FIG. 17) which is synthesized by condensation reaction from thiol-modified oligothiophene derivative (compound 3 shown in FIG. 17) and alkyl-modified dipyrromethene (compound 4 shown in FIG. 17) according to the synthesis scheme shown in FIG. 17.

In other words, the porphyrin as the organic semiconductor molecule according to the embodiment is synthesized by the steps of binding a thioacetyl group to one end of oligothiophene (compound 1, with n=1 to 5, shown in FIG. 17), thereby giving compound 2 shown in FIG. 17, causing an aldehyde group to occur at the other end, thereby giving compound 4 shown in FIG. 17. Condensation and oxidation reactions are performed on the dipyrromethene (compound 4 shown in FIG. 17), thereby giving the porphyrin derivative (the organic semiconductor molecule according to the embodiment, which is compound 5 shown in FIG. 17). Incidentally, condensation and oxidation reactions on pyrrole give the organic semiconductor molecule represented by the structural formula (105) of Reference Example 1.

The following is a description of the method for synthesis of the organic semiconductor molecule according to the embodiment, which is represented by the formula (104).

[Synthesis of Compound 2 (n=2) Shown in FIG. 17]

A THF solution containing 10 g (60 mmol) of compound 1 (n=2) in 100 mL is given slowly dropwise 1.6 M n-butyl lithium solution (37 mL or 60 mmol) at −78° C. under an argon stream. After 30 minutes, the solution is given 1.9 g (60 mmol) of sulfur (S) and then stirred at 0° C. for one hour. With the atmosphere cooled to −78° C., the solution is given 5 mL (72 mmol) of acetyl chloride and stirred for one hour. The reaction liquid is allowed to stand at room temperature and stirred overnight. Water is added to suspend reaction, and then dichloromethane is added. The reaction product is washed with water and then saturated NaCl solution and finally dried. Upon purification by silica gel column chromatography (hexane:ether=2:1, there is obtained 10.5 g of yellowish solids (yields: 73%). The results of analysis are as follows.

$^1$H-NMR (CDCl$_3$): δ 7.25 (s, 1H), 7.20 (d, 1H), 7.15 (d, 1H), 7.07 (d, 1H), 7.03 (d, 1H), 2.41 (s, 3H).

[Synthesis of Compound 3 (n=2) shown in FIG. 17]

A dichloroethane solution containing 2 g (8.3 mmol) of compound 2 (n=2) and 1.3 mL of DMF in 10 mL is given slowly phosphorus oxychloride (0.9 mL or 9.1 mmol) under an argon stream. After refluxing overnight, the reaction liquid is slowly added to 50 mL of saturated aqueous solution of sodium acetate, so that reaction is suspended. The reaction liquid is given dichloromethane and washed with water and then saturated NaCl solution and finally dried. Upon purification by silica gel column chromatography (hexane:dichloromethane=1:3), there is obtained 1.1 g of yellowish solids (yields: 50%). The results of analysis are as follows.

$^1$H-NMR (CDCl$_3$): δ 9.85 (s, 1H), 7.91 (d, 1H), 7.80 (d, 1H), 7.51 (d, 1H), 7.12 (d, 1H), 7.04 (d, 1H), 2.40 (s, 3H).

MALDI-TOF-MS: m/z=268.37 [M$^+$]

Calculated from $C_{11}H_8O_2S_3$: m/z=268.69 [M$^+$]

[Synthesis of Compound 4 Shown in FIG. 17]

Pyrrole (150 mL or 1.5 mol) containing n-hexanal (6 mL or 50 mmol), which has been substituted with argon (for 20 minutes), is added to trifluoroacid (TFA) (0.9 mL), followed by stirring at room temperature for 30 minutes. Reaction is suspended by adding TEA (1 mL). The reaction product is freed of excess pyrrole by vacuum distillation and purified by silica gel column chromatography (hexane:ethyl acetate:TEA=8:1:0.1). There is obtained 3.36 g of brownish oil (yields: 30%). The results of analysis are as follows.

$^1$H-NMR (CDCl$_3$): δ 7.77 (s, 1H), 6.65 (s, 2H), 6.17 (t, 2H), 6.09 (s, 2H), 3.99 (t, 1H), 1.96 (m, 2H), 1.32 (m, 6H), 0.89 (t, 3H).

[Synthesis of Compound 5 (n=2) Shown in FIG. 17]

A chloromethane solution containing 0.8 g (3.0 mmol) of compound 3 (n=2) and 0.68 g (3.0 mmol) of compound 4 in 300 mL, which has been substituted with argon (for 20 minutes), is given 0.36 mL of TFA, followed by stirring at room temperature for three hours. The solution is given 0.72 g of p-chloranil, followed by stirring for one hour. Reaction is suspended by adding 0.64 mL of TEA. The reaction liquid is given a methanol solution containing 0.77 g of $Zn(OAc)_2$ in 50 mL, followed by stirring at room temperature for two hours. The reaction liquid is filtered through a silica shot column and washed with water and saturated NaCl solution and dried. The reaction product is purified by silica gel column chromatography (hexane:dichloromethane=1:2). Thus there is obtained 0.22 g of reddish solids (yields: 15%). The results of analysis are as follows.

MALDI-TOF-MS: m/z=990.10 [M+]

Calculated from $C_{50}H_{44}N_4O_2S_8Zn$: m/z=990.69 [M+]

[Synthesis of Compound 6 (n=2) shown in FIG. 17]

A chloromethane solution containing 350 mg (1.0 mmol) of compound 3 (n=2), 120 mg (1.0 mmol) of n-hexanal, and 460 mg (2.0 mmol) of compound 4 in 200 mL, which has been substituted with argon (for 20 minutes), is given 0.24 mL of TFA, followed by stirring at room temperature for three hours. The solution is given 460 mg of p-chloranil, followed by stirring for one hour. The reaction liquid is given a methanol solution containing 0.28 g of $Zn(OAc)_2$ in 20 mL. The reaction liquid is filtered through a silica shot column and washed with water and saturated NaCl solution and dried. The reaction product is purified by silica gel column chromatography (hexane:dichloromethane=1:2). Thus there is obtained 0.09 g of reddish solids (yields: 11%). The results of analysis are as follows.

MALDI-TOF-MS: m/z=820.19 [M+]

Calculated from $C_{45}H_{48}N_4OS_3Zn$: m/z=820.22 [M+]

Figure 18:
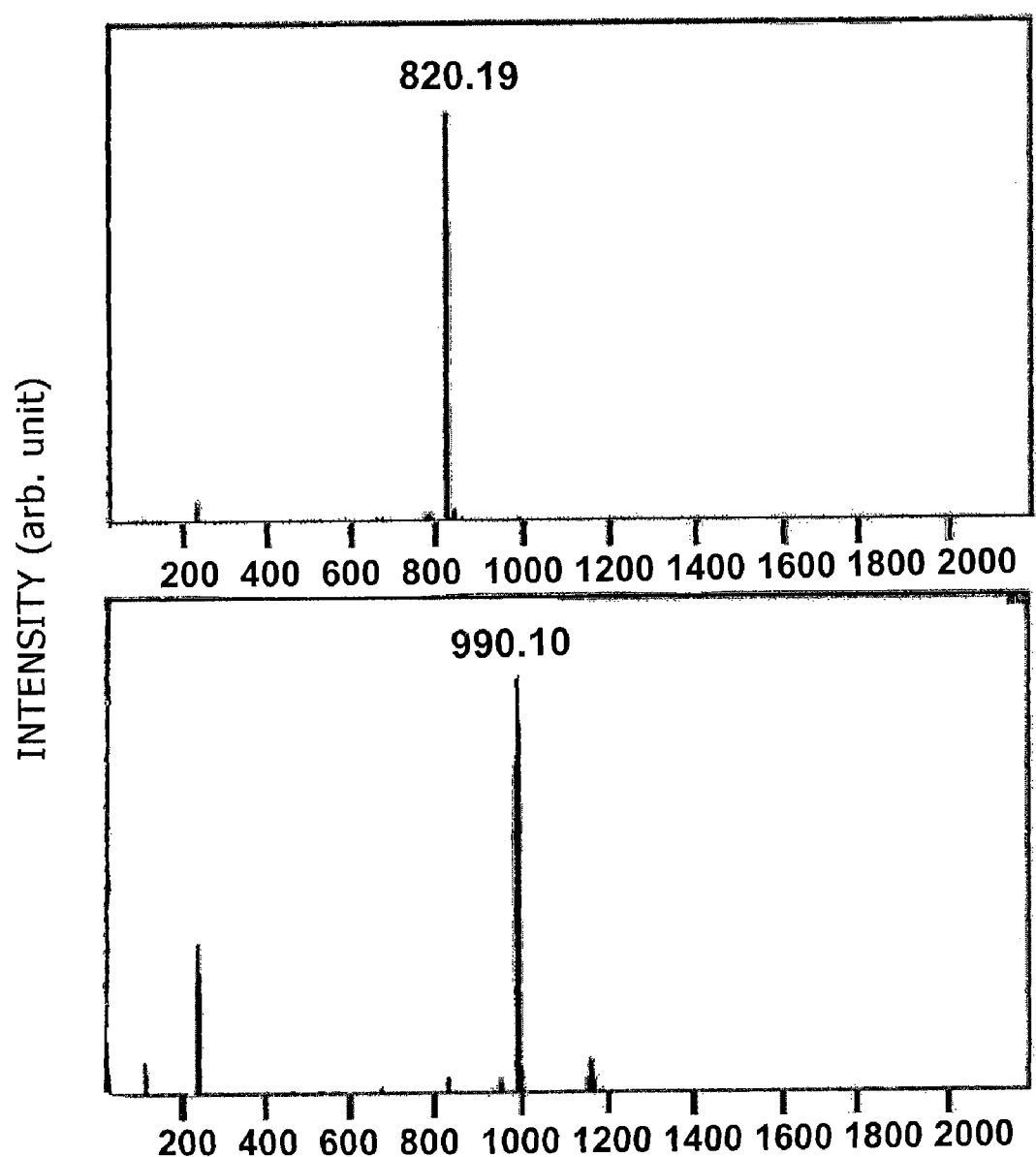
FIG. 18 is diagrams showing respectively (lower and upper) MALDI-TOF-MS spectrum of the compound 5 of FIG. 17 (organic semiconductor molecule (n=2) according to Example) and the compound 6 (organic semiconductor molecule (n=2) according to Reference Example)

Incidentally, compound 5 (which is the organic semiconductor molecule (n=2) according to Example) and compound 6 (which is the organic semiconductor molecule (n=2) according to Reference Example), as shown in FIG. 17, were analyzed by MALDI-TOF-MS spectroscopy. The results are shown in the upper and lower parts of FIG. 18.

[Synthesis of Compound 2 (n=3) Shown in FIG. 17]

A THF solution containing 1.0 g (4.0 mmol) of compound 1 (n=3) in 15 mL is slowly added dropwise 3.0 mL (4.8 mmol) of 1.6 M n-butyl lithium solution at −78° C. under an argon stream. After 30 minutes, 0.15 g (4.8 mmol) of sulfur (S) is added, followed by stirring at 0° C. for one hour. With the atmosphere cooled to −78° C., the solution is given 0.33 mL (4.8 mmol) of acetyl chloride, followed by stirring for one hour. The reaction liquid is allowed to stand at room temperature and stirred overnight. After that, reaction is suspended by addition of water. The reaction liquid is given dichloromethane, and washed sequentially with water and saturated NaCl solution, and dried. The reaction product is purified by silica gel column chromatography (hexane:ether=2:1). Thus there is obtained 0.8 g of yellowish solids (yields: 63%). The results of analysis are as follows.

$^1$H-NMR (CDCl$_3$): δ 7.26-7.05 (m, 7H), 2.45 (s, 3H)

MALDI-TOF-MS: m/z=321.77 [M+]

Calculated from $C_{14}H_{10}OS_4$: m/z=321.96 [M+]

[Synthesis of Compound 3 (n=3) shown in FIG. 17]

A dichloroethane solution containing 0.54 g (1.7 mmol) of compound 2 (n=3) and 0.14 mL of DMF in 10 mL is slowly given 0.18 mL (2.0 mmol) of phosphorus oxychloride under an argon stream, followed by refluxing overnight. The reaction liquid is slowly added dropwise to 50 mL of saturated aqueous solution of sodium acetate to suspend reaction. With dichloromethane added, the reaction liquid is washed sequentially with water and saturated NaCl solution and dried. The reaction product is purified by silica gel column chromatography (hexane:dichloromethane=1:3). Thus there is obtained 1.9 g of yellowish solids (yields: 34%). The results of analysis are as follows.

$^1$H-NMR (CDCl$_3$): δ 9.88 (s, 1H), 7.29-7.08 (m, 6H), 2.46 (s, 3H).

MALDI-TOF-MS: m/z=350.37 [M+]

Calculated from $C_{15}H_{10}O_2S_4$: m/z=349.95 [M+]

[Synthesis of Compound 5 (n=3) Shown in FIG. 17]

A chloromethane solution containing 1 g (2.85 mmol) of compound 3 (n=3) and 0.66 g (2.85 mmol) of compound 4 in 300 mL, which has been substituted with argon (for 20 minutes), is given 0.34 mL of TFA, followed by stirring at room temperature for three hours. The solution is given 0.67 mg of p-chloranil, followed by stirring for one hour. The reaction liquid is given a methanol solution containing 0.77 g of $Zn(OAc)_2$ in 50 mL, followed by stirring at room temperature for two hours. The reaction liquid is filtered through a silica shot column and washed sequentially with water and saturated NaCl solution and dried. The reaction product is purified by silica gel column chromatography (hexane:dichloromethane=1:2). Thus there is obtained 0.16 g of reddish solids (yields: 10%). The results of analysis are as follows.

MALDI-TOF-MS: m/z=1153.87 [M+H]+

Calculated from $C_{58}H_{49}N_4O_2S_8Zn$: m/z=1153.08 [M+H]+

[Synthesis of Compound 6 (n=3) Shown in FIG. 17]

A chloromethane solution containing 174 mg (0.5 mmol) of compound 3 (n=3), 60 mg (0.5 mmol) of n-hexanal, and 230 mg (1.0 mmol) of compound 4 in 100 mL, which has been substituted with argon (for 20 minutes), is given 0.12 mL of TFA, followed by stirring at room temperature for three hours. The solution is given 230 mg of p-chloranil, followed by stirring for one hour. The reaction liquid is given a methanol solution containing 0.14 g of $Zn(OAc)_2$ in 10 mL. The reaction liquid is filtered through a silica shot column and washed sequentially with water and saturated NaCl solution and dried. The reaction product is purified by silica gel column chromatography (hexane:dichloromethane=1:2). Thus there is obtained 45 mg of reddish solids (yields: 10%). The results of analysis are as follows.

MALDI-TOF-MS: m/z=903.97 [M+H]+

Calculated from $C_{49}H_{51}N_4OS_4Zn$: m/z=903.21 [M+H]+

Figure 19:
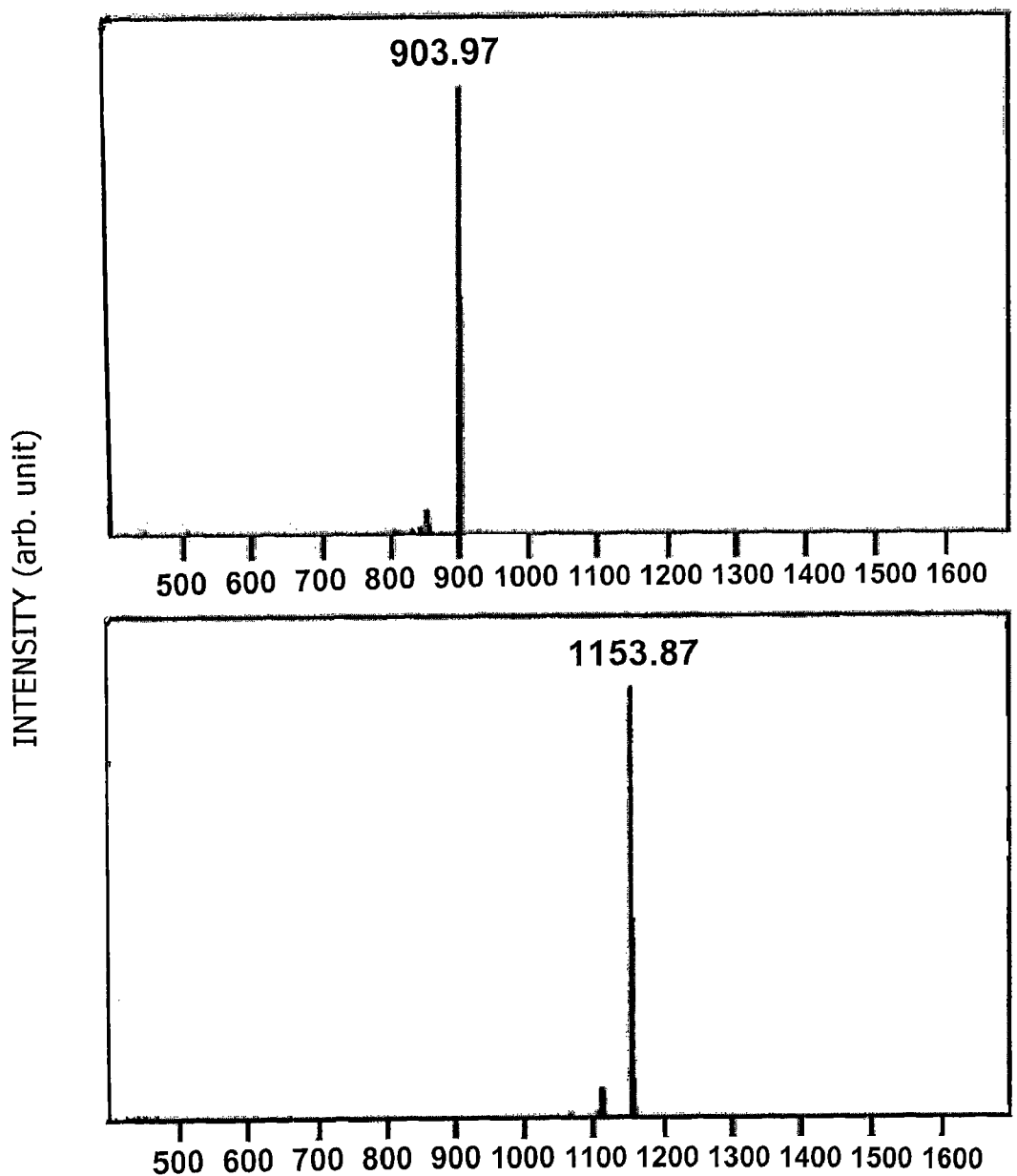
FIG. 19 is diagrams showing respectively (lower and upper) MALDI-TOF-MS spectrum of the compound 5 of FIG. 17 (organic semiconductor molecule (n=3) according to Example) and the compound 6 (organic semiconductor molecule (n=3) according to Reference Example).

Incidentally, compound 5 (which is the organic semiconductor molecule (n=3) according to Example) and compound 6 (which is the organic semiconductor molecule (n=3) according to Reference Example), as shown in FIG. 17, were analyzed by MALDI-TOF-MS spectroscopy. The results are shown in the upper and lower parts of FIG. 19.

While the embodiment has been described in its preferred embodiments, it is to be understood that the embodiment is not limited to them. The organic electronic device, the structure and constitution of the conductive path, and the conditions for fabrication are merely exemplary, and they can be changed properly. The organic electronic device according to the embodiment may take on the field effect transistor (FET) for display units and various electronic machines and equipment. The FET may be used in the form of monolithic integrated circuit or discrete parts. The fine particles are not limited to gold (Au) fine particles. They include those of any metal (such as silver and platinum), semiconductors (such as cadmium sulfide, cadmium selenide, and silicon), and organic materials (such as poly(3,4-ethylenedioxythiophene)/polystyrenesulfonic acid [PEDOT/PSS], polythiophene, and polyaniline. The first and second organic semiconductor molecules are not limited to porphyrin, 4,4'-biphenyldithiol (BPDT), and fullerene ($C_{60}$). An organic semiconductor compound such as an organic-inorganic complex substance, supermolecule, natural compound, intravital substance (e.g. protein, DNA or the like), polymer compound, or the like may be used as each of the first and second organic semiconductor molecules. The element separation region may be formed between the p-channel type transistor and the n-channel type transistor, or may be omitted in some cases.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. An organic electronic device which has a conductive path comprising:
    fine particles,
    a plurality of first organic semiconductor molecules having a first conductive type and that binds at least two of said fine particles together, and
    a plurality of second organic semiconductor molecules having a second conductive type and that are captured in a state of noncovalent bond in a molecule recognition site that exists among said fine particles, such that the second organic semiconductor molecules are confined by n-n mutual action with the first organic semiconductor molecules in a large number of nano spaces within a network structure formed by the fine particles bound together by the first organic semiconductor molecules.

2. The organic electronic device according to claim 1, wherein the first conductive type is p-type and the second conductive type is n-type.

3. organic electronic device according to claim 2, wherein the conductive path behaves as n-type.

4. The organic electronic device according to claim 2, wherein the second organic semiconductor molecule is fullerene.

5. The organic electronic device according to claim 1, wherein the first organic semiconductor molecule has a functional group chemically binding to said fine particles on an end thereof.

6. The organic electronic device according to claim 5, wherein the first organic semiconductor molecule is one which has a conjugated bond and also has at both ends thereof at least one kind of functional group selected from the group consisting of thiol group (—SH), amino group (—$NH_2$), isocyano group (—NC), thioacetyl group (—$SCOCH_3$), trichlorosilyl group (—$Si(Cl)_3$), ammonium group (—$NH_3^+$), phosphoric group, and carboxyl group (—COOH).

7. The organic electronic device according to claim 1, wherein the fine particles are conductor, semiconductor, or insulator.

8. The organic electronic device according to claim 1, wherein the fine particles have a mean particle size of $1 \times 10^{-8}$ m or less.

9. The organic electronic device according to claim 1, which is a field effect transistor in which a channel-forming region that behaves as the second conductive type is formed according to the conductive path.

* * * * *